(12) United States Patent
Yang et al.

(10) Patent No.: US 11,309,421 B2
(45) Date of Patent: *Apr. 19, 2022

(54) SEMICONDUCTOR DEVICES

(71) Applicant: SAMSUNG ELECTRONICS CO., LTD., Suwon-si (KR)

(72) Inventors: Jung-Gil Yang, Hwaseong-si (KR); Beom-Jin Park, Hwaseong-si (KR); Seung-Min Song, Hwaseong-si (KR); Geum-Jong Bae, Suwon-si (KR); Dong-Il Bae, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

This patent is subject to a terminal disclaimer.

(21) Appl. No.: 16/816,971

(22) Filed: Mar. 12, 2020

(65) Prior Publication Data
US 2020/0220006 A1 Jul. 9, 2020

Related U.S. Application Data

(63) Continuation of application No. 16/115,114, filed on Aug. 28, 2018, now Pat. No. 10,629,740.

(30) Foreign Application Priority Data

Nov. 17, 2017 (KR) ........................ 10-2017-0154320

(51) Int. Cl.
*H01L 29/78* (2006.01)
*H01L 29/06* (2006.01)
(Continued)

(52) U.S. Cl.
CPC ........ *H01L 29/785* (2013.01); *H01L 21/3086* (2013.01); *H01L 21/762* (2013.01);
(Continued)

(58) Field of Classification Search
CPC ............. H01L 29/785; H01L 29/78696; H01L 29/42392; H01L 29/775; H01L 29/0649;
(Continued)

(56) References Cited

U.S. PATENT DOCUMENTS 7,402,483 B2 7/2008 Yun et al.
8,753,942 B2 6/2014 Kuhn et al.
(Continued)

*Primary Examiner* — Julia Slutsker
(74) *Attorney, Agent, or Firm* — F. Chau & Associates, LLC

(57) ABSTRACT

A semiconductor device includes channels, a gate structure, and a source/drain layer. The channels are disposed at a plurality of levels, respectively, and spaced apart from each other in a vertical direction on an upper surface of a substrate. The gate structure is disposed on the substrate, at least partially surrounds a surface of each of the channels, and extends in a first direction substantially parallel to the upper surface of the substrate. The source/drain layer is disposed at each of opposite sides of the gate structure in a second direction substantially parallel to the upper surface of the substrate and substantially perpendicular to the first direction and is connected to sidewalls of the channels. A length of the gate structure in the second direction changes along the first direction at a first height from the upper surface of the substrate in the vertical direction.

20 Claims, 38 Drawing Sheets

(51) Int. Cl.
*H01L 29/66* (2006.01)
*H01L 21/308* (2006.01)
*H01L 21/762* (2006.01)
*H01L 21/8234* (2006.01)
*H01L 29/786* (2006.01)
*H01L 29/423* (2006.01)
*H01L 29/775* (2006.01)

(52) U.S. Cl.
CPC .. *H01L 21/823431* (2013.01); *H01L 29/0649* (2013.01); *H01L 29/42392* (2013.01); *H01L 29/6656* (2013.01); *H01L 29/6681* (2013.01); *H01L 29/66545* (2013.01); *H01L 29/775* (2013.01); *H01L 29/78696* (2013.01)

(58) Field of Classification Search
CPC ............. H01L 29/6681; H01L 21/3086; H01L 29/6656; H01L 21/762; H01L 21/823431; H01L 29/66545
See application file for complete search history.

(56) References Cited

U.S. PATENT DOCUMENTS

| | | | |
|---|---|---|---|
| 9,252,275 | B2 | 2/2016 | Rachmady et al. |
| 9,349,866 | B2 | 5/2016 | Ching |
| 9,412,849 | B1 | 8/2016 | Suk et al. |
| 9,673,277 | B2 | 6/2017 | Brand et al. |
| 9,673,279 | B2 | 6/2017 | Lee et al. |
| 2014/0001441 | A1 | 1/2014 | Kim et al. |
| 2015/0084041 | A1 | 3/2015 | Hur et al. |
| 2015/0295084 | A1 | 10/2015 | Obradovic et al. |
| 2016/0190239 | A1 | 6/2016 | Suk et al. |
| 2017/0154958 | A1 | 6/2017 | Fung et al. |
| 2017/0162579 | A1* | 6/2017 | Choi ................. H01L 29/66439 |
| 2017/0194479 | A1 | 7/2017 | Lee et al. |
| 2017/0256609 | A1 | 9/2017 | Bhuwalka et al. |
| 2018/0166319 | A1 | 6/2018 | Park et al. |
| 2019/0058052 | A1* | 2/2019 | Frougier ............. H01L 29/6653 |
| 2019/0157444 | A1 | 5/2019 | Yang et al. |

* cited by examiner

FIG. 2
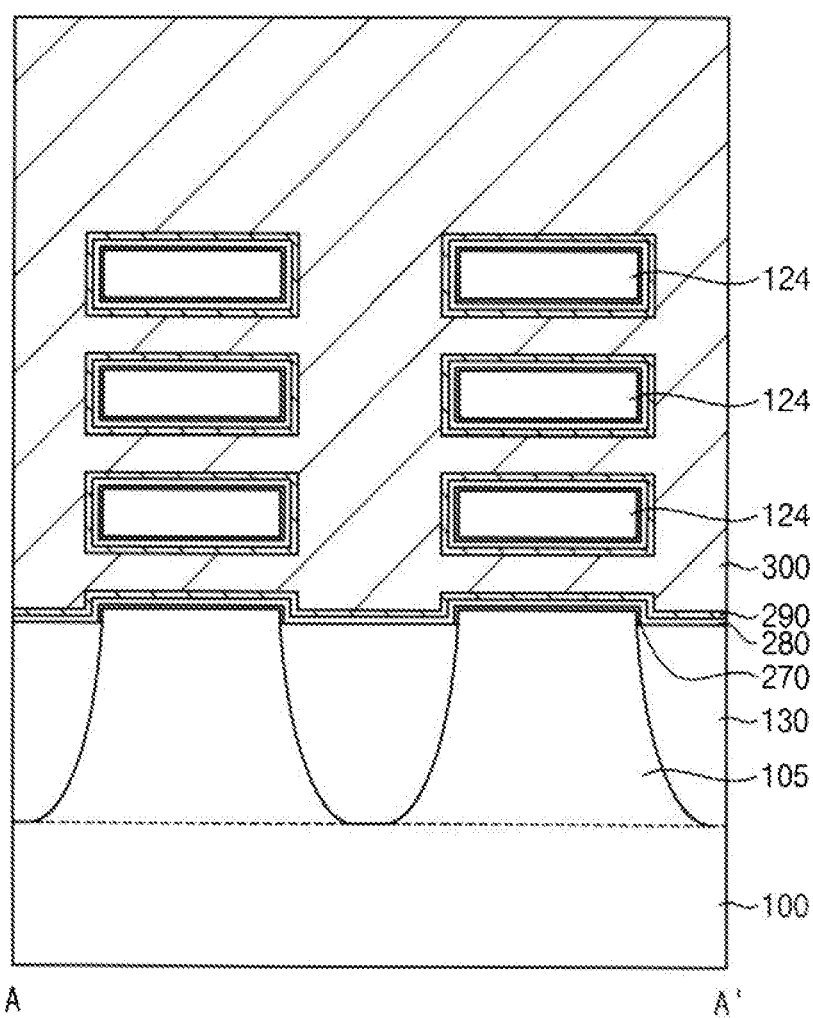
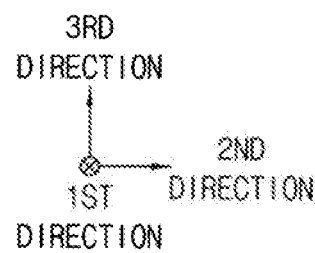

FIG. 7
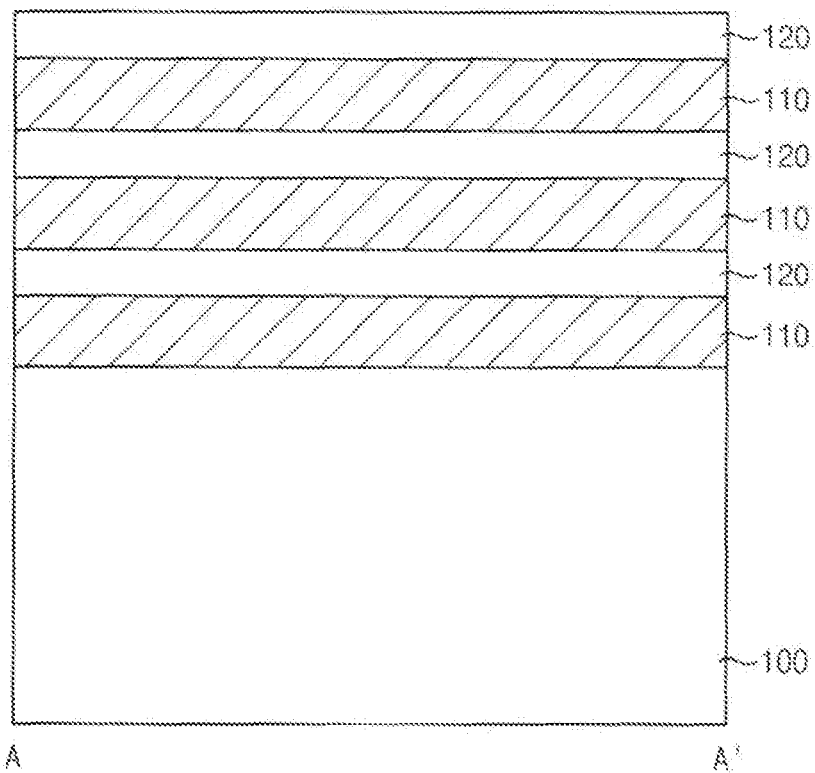
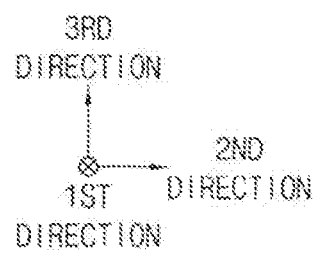

FIG. 9
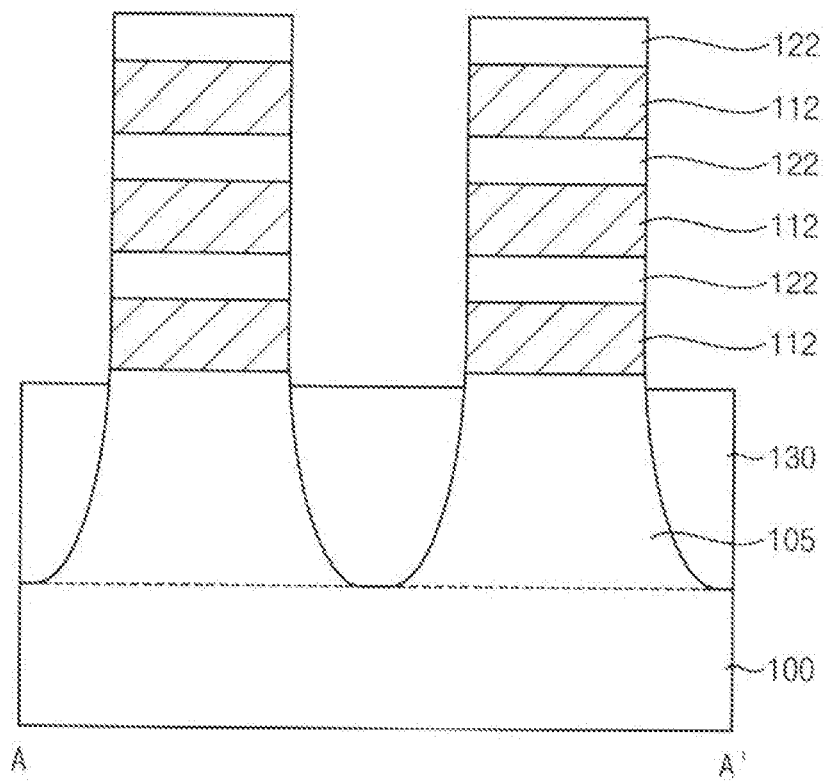
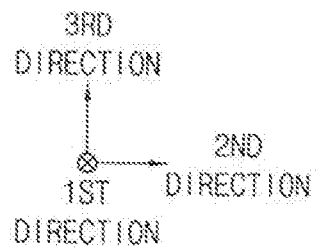

FIG. 18
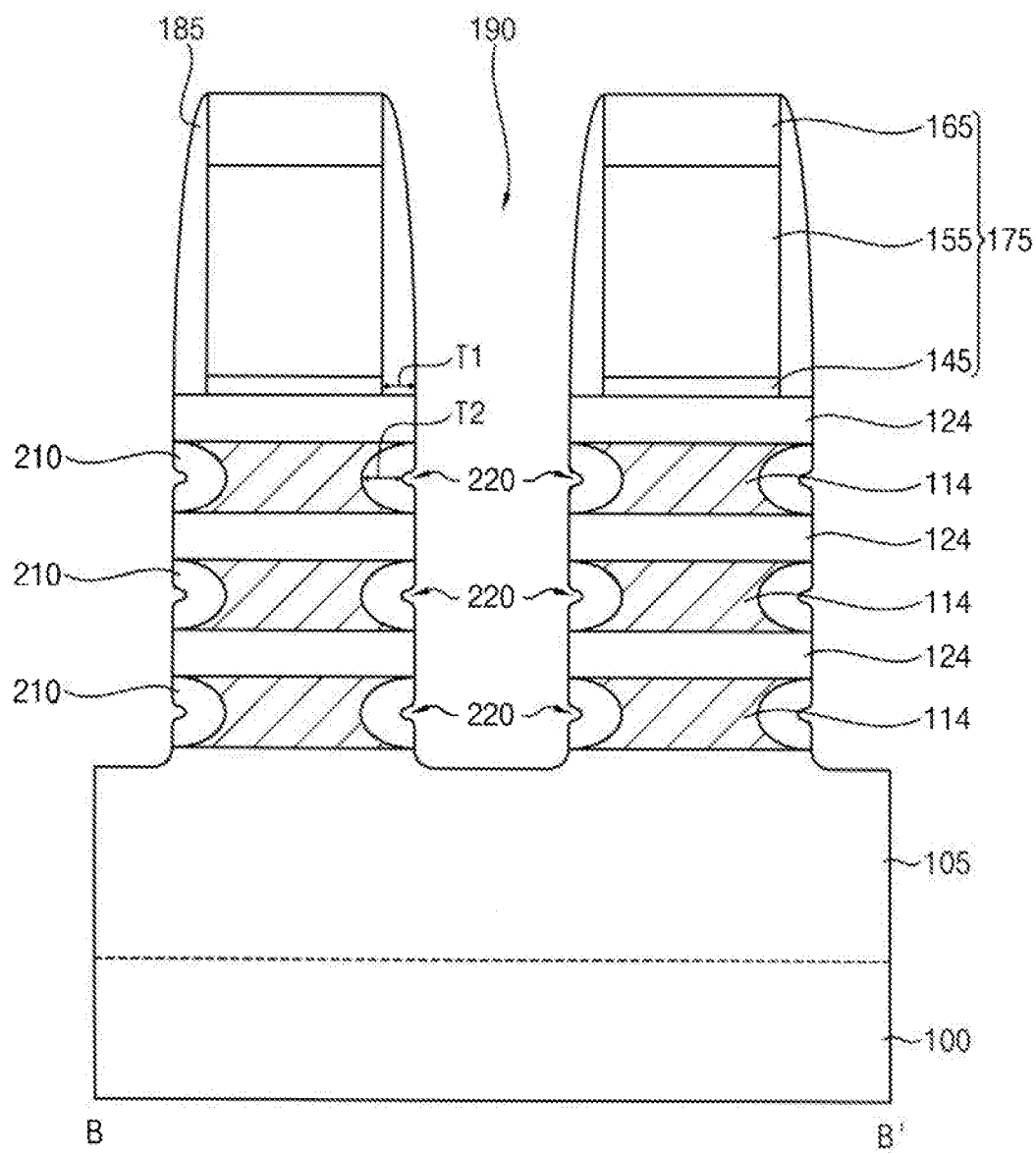
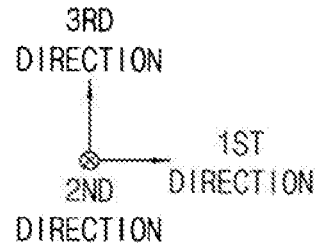

FIG. 22
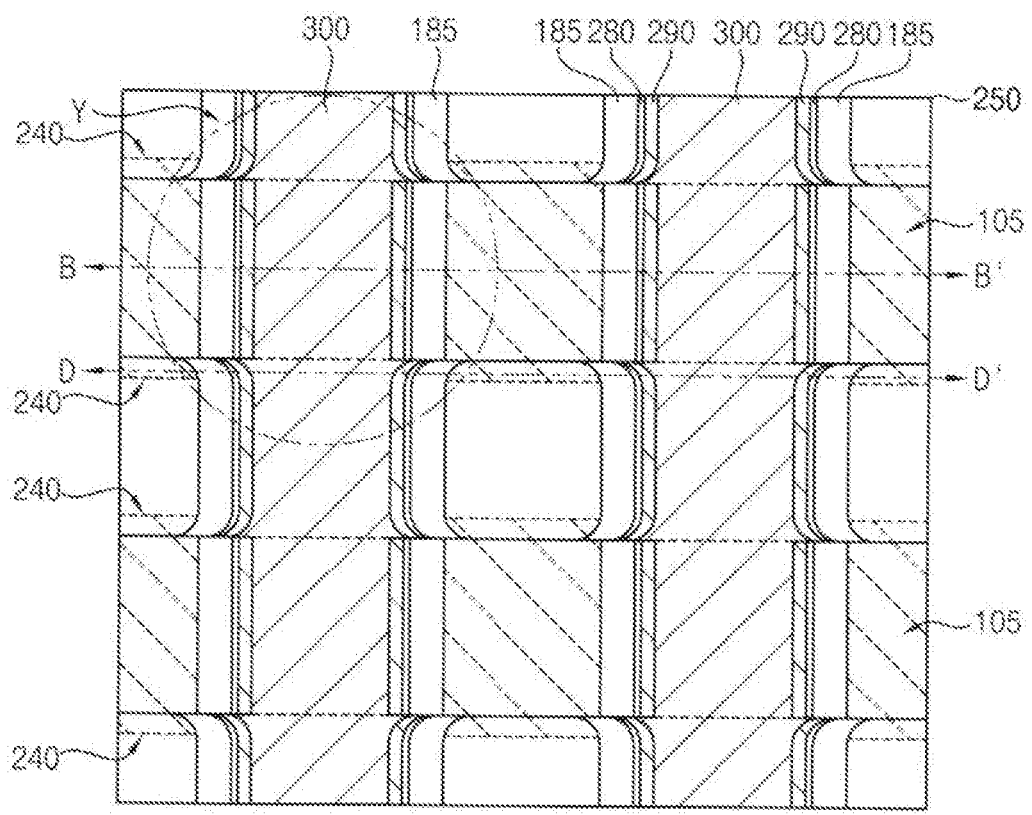
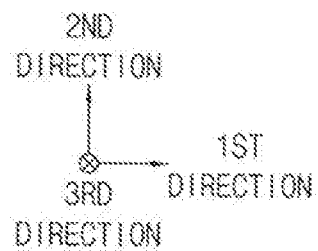

SEMICONDUCTOR DEVICES

CROSS-REFERENCE TO RELATED APPLICATION

This application is a continuation of U.S. application Ser. No. 16/115,114, filed on Aug. 28, 2018, which claims priority under 35 U.S.C. § 119 to Korean Patent Application No. 10-2017-0154320, filed on Nov. 17, 2017 in the Korean Intellectual Property Office (KIPO), the contents of which are herein incorporated by reference in their entirety.

TECHNICAL FIELD

Example embodiments of the present inventive concept relate to semiconductor devices, and more particularly, to semiconductor devices having vertically stacked channels.

DISCUSSION OF RELATED ART

A multi-bridge-channel metal-oxide-semiconductor field-effect transistor (MBCFET), which is different from the conventional planar metal-oxide-semiconductor field-effect transistor (MOSFET), may include a plurality of channels vertically stacked with a gate structure surrounding the channels. In general, the MBCFET may have a larger current drivability, better subthreshold swing, and larger on-off state current ratio than the conventional planar MOSFET. In the MBCFET, a sidewall of the gate structure may be covered by a spacer, and the characteristics of the MBCFET may be changed according to the length of the gate structure or the width of the spacer.

SUMMARY

Example embodiments provide a semiconductor device having good characteristics.

According to an example embodiment of the present inventive concept, there is provided a semiconductor device including channels, a gate structure, and a source/drain layer. The channels may be disposed at a plurality of levels, respectively, and may be spaced apart from each other in a vertical direction on an upper surface of a substrate. The gate structure may be disposed on the substrate, may at least partially surround a surface of each of the channels, and may extend in a first direction substantially parallel to the upper surface of the substrate. The source/drain layer may be disposed at each of opposite sides of the gate structure in a second direction substantially parallel to the upper surface of the substrate and substantially perpendicular to the first direction, and may be connected to sidewalls of the channels. A length of the gate structure in the second direction may change along the first direction at a first height from the upper surface of the substrate in the vertical direction.

According to an example embodiment of the present inventive concept, there is provided a semiconductor device including channels, a gate structure, first and second spacers, and a source/drain layer. The channels may be disposed at a plurality of levels, respectively, and may be spaced apart from each other in a vertical direction on an upper surface of a substrate. The gate structure may be disposed on the substrate, may at least partially surround a surface of each of the channels, and may extend in a first direction substantially parallel to the upper surface of the substrate. The gate structure may include an upper portion disposed on an uppermost one of the channels and overlapping the channels in the vertical direction, and a lower portion disposed between the channels and between the substrate and a lowermost one of the channels, and overlapping the channels in the vertical direction. The first spacer may be disposed on each of opposite sidewalls of the upper portion of the gate structure in a second direction substantially parallel to the upper surface of the substrate and substantially perpendicular to the first direction. The second spacer may be disposed on each of opposite sidewalls of the lower portion of the gate structure in the second direction, and may have a horseshoe shape convex toward a central portion of the lower portion of the gate structure in the second direction. The source/drain layer may be disposed at each of opposite sides of the gate structure in the second direction, and may be connected to the channels. A length of the upper portion of the gate structure in the second direction may be greater than a minimum value of a length of the lower portion of the gate structure in the second direction.

According to an example embodiment of the present inventive concept, there is provided a semiconductor device including channels, a gate structure, and a source/drain layer. The channels may be disposed at a plurality of levels, respectively, and may be spaced apart from each other in a vertical direction on an upper surface of a substrate. The gate structure may be disposed on the substrate, may at least partially surround a surface of each of the channels, and may extend in a first direction substantially parallel to the upper surface of the substrate. The source/drain layer may be disposed at each of opposite sides of the gate structure in a second direction substantially parallel to the upper surface of the substrate and substantially perpendicular to the first direction, and may be connected to sidewalls of the channels. A length in the second direction of a first portion of the gate structure not overlapping the channels in the vertical direction but close thereto may increase from a first height, which may be a height of an upper surface of an uppermost one of the channels from the upper surface of the substrate, toward the upper surface of the substrate.

In an MBCFET in accordance with an example embodiment of the present inventive concept, the parasitic capacitance between the gate structure surrounding the vertically stacked channels and the source/drain layer may be reduced.

BRIEF DESCRIPTION OF THE DRAWINGS

Example embodiments of the present inventive concept will be more clearly understood from the following detailed description taken in conjunction with the accompanying drawings, in which:

FIGS. 1 to 5 are a plan view and cross-sectional views illustrating a semiconductor device in accordance with an example embodiment of the present inventive concept;

FIGS. 6 to 21 are plan views and cross-sectional views illustrating a method of manufacturing a semiconductor device in accordance with an example embodiment of the present inventive concept;

FIGS. 22 to 25 are a plan view and cross-sectional views illustrating a semiconductor device in accordance with an example embodiment of the present inventive concept.

Figure 1:
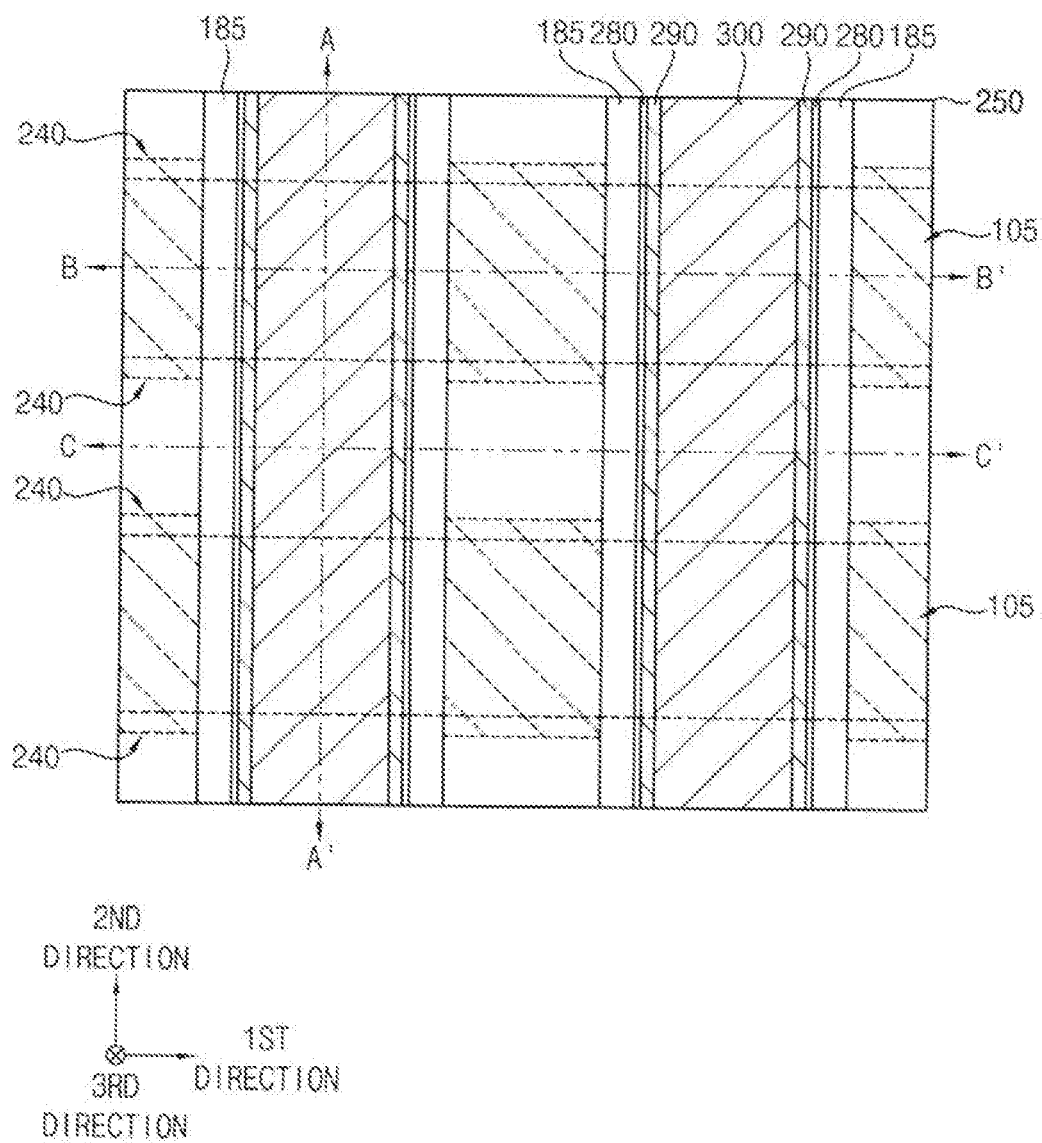

Since the drawings in FIGS. 1-38 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 3:
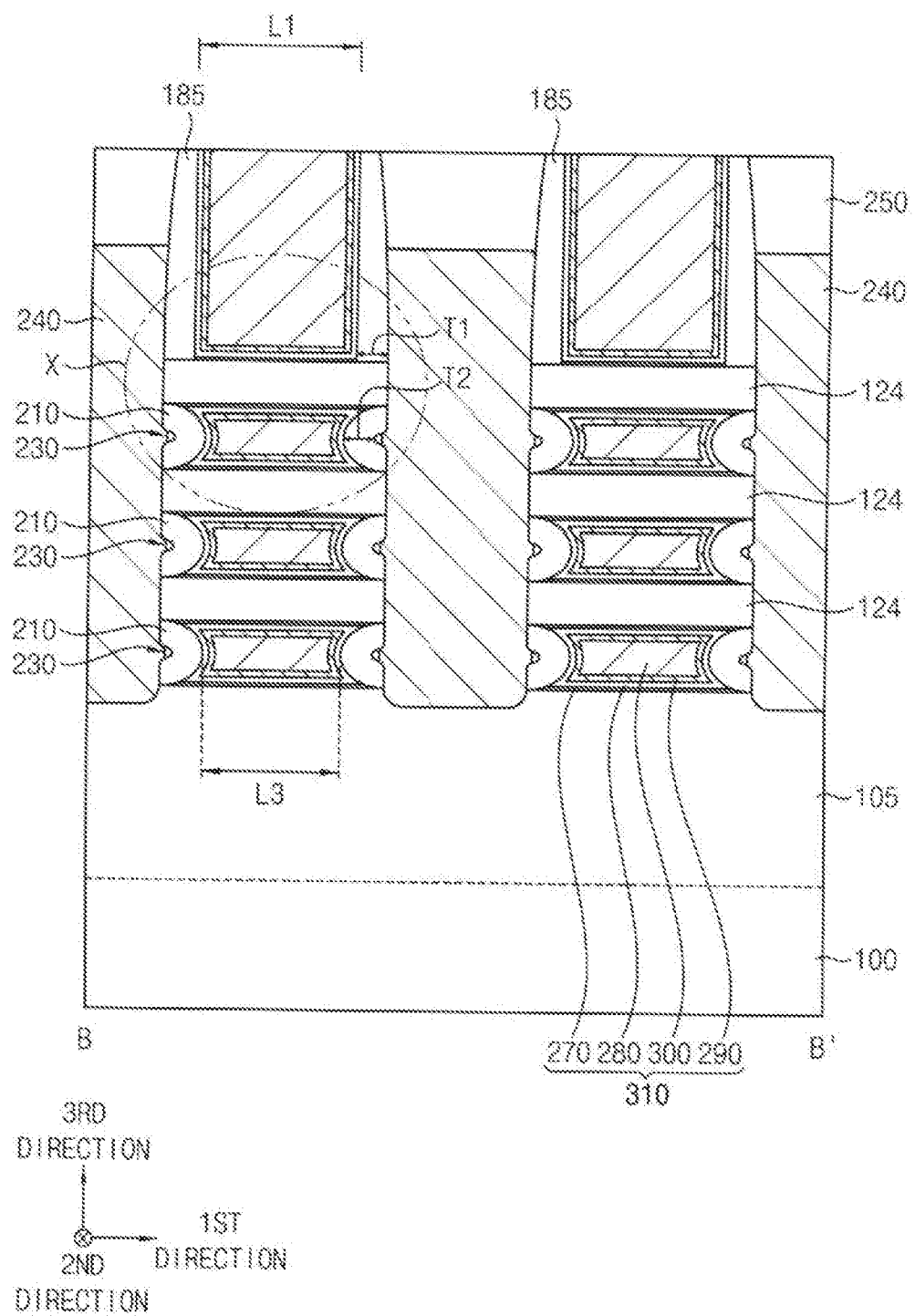
Figure 4:
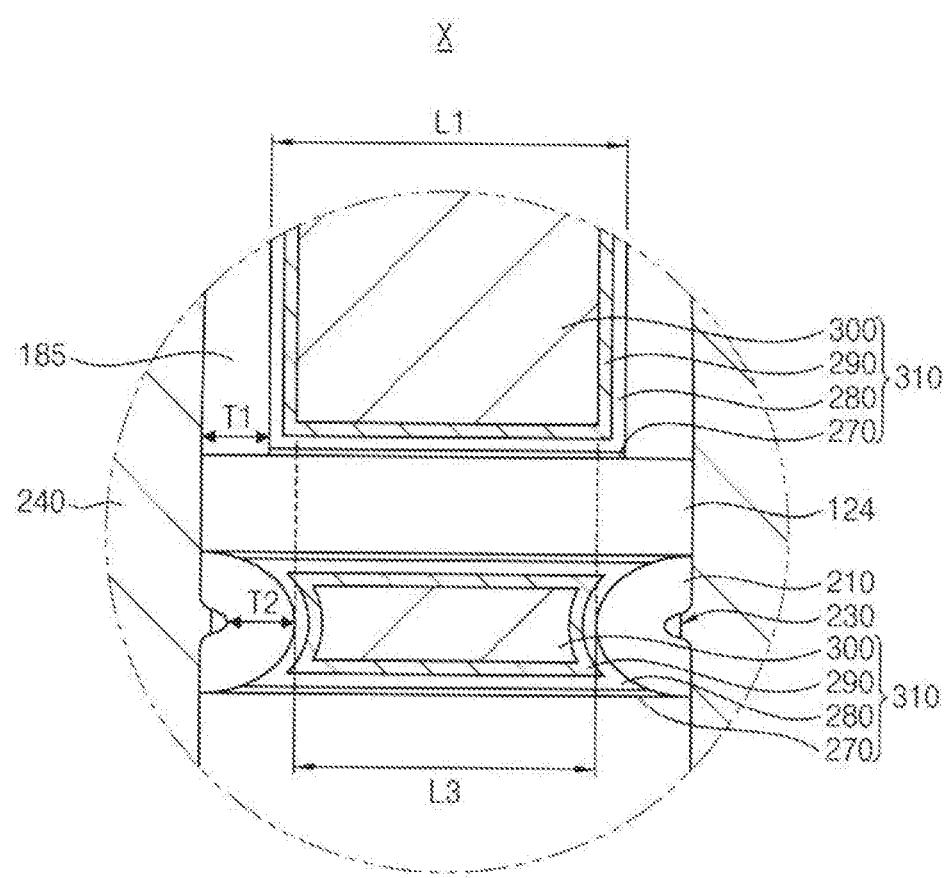
Figure 5:
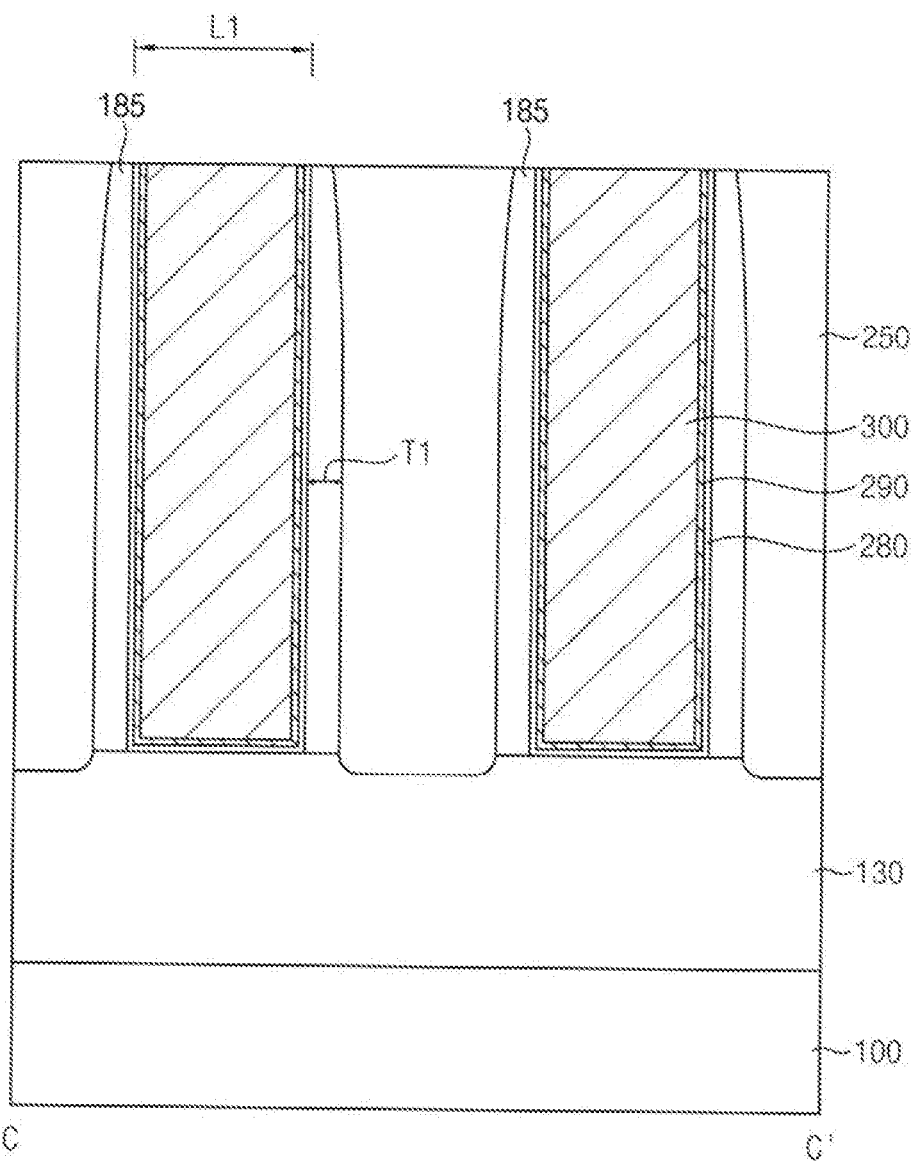

FIGS. 1 to 5 are a plan view and cross-sectional views illustrating a semiconductor device in accordance with an example embodiment of the present inventive concept. FIG. 1 is the plan view, and FIGS. 2 to 5 are the cross-sectional views. FIGS. 2, 3 and 5 are cross-sectional views taken along lines A-A', B-B', and C-C', respectively, of FIG. 1. FIG. 4 is an enlarged cross-sectional view of a region X of FIG. 3.

Hereinafter, two directions substantially parallel to an upper surface of a substrate 100 and crossing each other may be referred to as first and second directions, respectively, and a direction substantially perpendicular to the upper surface of the substrate 100 may be referred to as a third direction. In an example embodiment of the present inventive concept, the first and second directions may be substantially perpendicular to each other.

Referring to FIGS. 1 to 5, the semiconductor device may include a semiconductor pattern 124, a gate structure 310, an epitaxial layer 240, and first and second spacers 185 and 210 on the substrate 100. The semiconductor device may further include an active region 105, an isolation pattern 130, and an insulation layer 250.

The substrate 100 may include a group IV semiconductor material, e.g., silicon (Si), germanium (Ge), silicon-germanium (SiGe), etc., or a III-V compound semiconductor, e.g., gallium phosphide (GaP), gallium arsenide (GaAs), gallium antimonide (GaSb), etc. In an example embodiment of the present inventive concept, the substrate 100 may be a silicon-on-insulator (SOI) substrate, or a germanium-on-insulator (GOI) substrate.

The active region 105 may protrude from the substrate 100 in the third direction, and may extend in the first direction. In the figures, two active regions 105 are shown, however, the present inventive concept may not be limited thereto. For example, more than two active regions 105 may be spaced apart from each other in the second direction. The active region 105 may be formed by partially removing an upper portion of the substrate 100, and thus may include a material substantially the same as that of the substrate 100. For example, after the upper portion of the substrate 100 being partially removed, the part of the substrate 100 remaining at the upper portion may be defined as the active region 105. In addition, the active region 105 may include a conductive region, e.g., a well doped with impurities, and a structure doped with impurities.

A sidewall of the active region 105 may be covered by the isolation pattern 130. The isolation pattern 130 may include an oxide, e.g., silicon oxide ($SiO_2$). The isolation pattern 130 may define the active region 105. For example, the active regions 105 and the isolation patterns 130 may be alternately arranged in the second direction.

A plurality of semiconductor patterns 124 may be formed at a plurality of levels, respectively, to be spaced apart from each other in the third direction from an upper surface of the active region 105. In the figures, the semiconductor patterns 124 are shown at three levels, respectively, however, the present inventive concept may not be limited thereto. For example, the semiconductor patterns 124 may be formed at two levels or more than three levels.

In the figures, only two semiconductor patterns 124 spaced apart from each other in the first direction are shown at each level on the active region 105 extending in the first direction, however, the present inventive concept may not be limited thereto. For example, more than two semiconductor patterns 124 may be formed to be spaced apart from each other in the first direction at each level on the active region 105.

In an example embodiment of the present inventive concept, the semiconductor pattern 124 may be nanosheets or nanowires including a semiconductor material, e.g., silicon (Si), germanium (Ge), etc. Alternatively, the semiconductor pattern 124 may include a compound semiconductor, and may include, for example, a group IV-IV compound semiconductor or a group III-V compound semiconductor. The semiconductor pattern 124 may include a material substantially the same as that of the active region 105, or may include a material different from that of the active region 105. In an example embodiment of the present inventive concept, the semiconductor pattern 124 may serve as a channel of a transistor, which may be referred to as the channel. Thus, the semiconductor device may include the semiconductor patterns 124 as the channels at a plurality of levels, respectively, spaced apart from each other in a vertical direction (the third direction) on the upper surface of the substrate 100.

The epitaxial layer 240 may extend in the third direction from the upper surface of the active region 105, and may commonly contact respective sidewalls of the semiconductor patterns 124 at the plurality of levels to be connected thereto. The epitaxial layer 240 may contact a lower portion of an outer sidewall of the first spacer 185 and an outer sidewall of the second spacer 210. In an example embodiment of the present inventive concept, an air gap 230 may be formed between the epitaxial layer 240 and the second spacer 210.

In an example embodiment of the present inventive concept, the epitaxial layer 240 may include single crystalline silicon carbide (SiC) doped with n-type impurities or single crystalline silicon (Si) doped with n-type impurities, and thus may serve as a source/drain layer of an NMOS transistor. Alternatively, the epitaxial layer 240 may include single crystalline silicon-germanium (SiGe) doped with p-type impurities, and thus may serve as a source/drain layer of a PMOS transistor. The epitaxial layer 240 may be referred to as a source/drain layer.

The gate structure 310 may be formed on the substrate 100, and may surround a central portion of the semiconductor pattern 124 in the first direction. For example, the gate structure 310 may at least partially surround a surface of each of the semiconductor patterns 124 (the channels). In the figures, the gate structure 310 is shown to cover the semiconductor patterns 124 on two active regions 105, however, the present inventive concept may not be limited thereto. For example, the gate structure 310 may extend in the second direction, and may cover the semiconductor patterns 124 on more than two active regions 105 spaced apart from each other in the second direction, or the semiconductor patterns 124 on only one active region 105.

In the figures, two gate structures 310 are shown on the substrate 100, however, the present inventive concept may not be limited thereto. For example, more than two gate structures 310 spaced apart from each other in the first direction may be formed on the substrate 100.

The gate structure 310 may include an interface pattern 270, a gate insulation pattern 280, a workfunction control pattern 290, and a gate electrode 300 sequentially stacked from a surface of each of the semiconductor patterns 124 or the upper surface of the active region 105.

The interface pattern 270 may be formed on the upper surface of the active region 105 and the surfaces of the semiconductor patterns 124, and the gate insulation pattern 280 may be formed on a surface of the interface pattern 270 and inner sidewalls of the first and second spacers 185 and 210. The interface pattern 270 may surround the semiconductor pattern 124. The workfunction control pattern 290 may be formed on the gate insulation pattern 280, and the gate electrode 300 may fill a space between the semiconductor patterns 124 spaced apart from each other in the third direction, a space between the active region 105 and a lowermost one of the semiconductor patterns 124, and a space defined by an inside of the first spacer 185 on an uppermost one of the semiconductor patterns 124.

The interface pattern 270 may include an oxide, e.g., silicon oxide ($SiO_2$), and the gate insulation pattern 280 may include a metal oxide having a high-k dielectric constant with a dielectric constant value higher than that of the silicon oxide ($SiO_2$), e.g., hafnium oxide ($HfO_2$), tantalum oxide ($Ta_2O_5$), zirconium oxide ($ZrO_2$), etc.

The workfunction control pattern 290 may include at least one of, e.g., titanium nitride (TiN), titanium oxynitride (TiON), titanium oxycarbonitride (TiOCN), titanium silicon nitride (TiSiN), titanium silicon oxynitride (TiSiON), titanium aluminum oxynitride (TiAlON), tantalum nitride (TaN), tantalum oxynitride (TaON), tantalum aluminum nitride (TaAlN), tantalum aluminum oxynitride (TaAlON), tungsten nitride (WN), tungsten carbonitride (WCN), aluminum oxide ($Al_2O_3$), etc. The gate electrode 300 may include a metal, e.g., titanium (Ti), aluminum (Al), etc., a metal alloy, or a nitride or carbide of the metal.

The gate structure 310 together with the epitaxial layer 240 serving as a source/drain layer, and the semiconductor pattern 124 serving as a channel may form a transistor. The epitaxial layer 240 (the source/drain layer) may be disposed at each of opposite sides of the gate structure 310, and the epitaxial layers 240 (the source/drain layers) may be connected to sidewalls of the semiconductor pattern 124 (the channel). The transistor may be an NMOS transistor or a PMOS transistor according to the conductivity type of the impurities doped in the epitaxial layer 240. For example, the epitaxial layer 240 serving as a source/drain layer may be doped with n-type impurities for NMOS transistor or doped with p-type impurities for PMOS transistor. The transistor may include the plurality of semiconductor patterns 124 serving as channels sequentially stacked in the third direction, and thus may be an MBCFET.

The gate structure 310 may include an upper portion on an uppermost one of the semiconductor patterns 124 and overlapping the semiconductor pattern 124 in the third direction, and a lower portion between the semiconductor patterns 124 and between the substrate 100 and a lowermost one of the semiconductor patterns 124 and overlapping the semiconductor pattern 124 in the third direction. Further, the gate structure 310 may include a portion on the isolation pattern 130, i.e., a lateral portion not overlapping the semiconductor pattern 124 in the third direction.

In an example embodiment of the present inventive concept, a first length L1 of the upper portion of the gate structure 310 in the first direction may be greater than a third length L3 of the lower portion of the gate structure 310 in the first direction, in which the third length L3 may be a minimum length of the lower portion of the gate structure 310 in the first direction.

The gate structure 310 may be electrically insulated from the epitaxial layer 240 by the first and second spacers 185 and 210.

The first spacer 185 may cover each of opposite sidewalls of the upper portion of the gate structure 310 in the first direction and each of opposite sidewalls of the lateral portion of the gate structure 310 in the first direction. The first spacer 185 may have a sidewall substantially perpendicular to the upper surface of the substrate 100.

The second spacer 210 may cover each of opposite sidewalls of the lower portion of the gate structure 310 in the first direction. In an example embodiment of the present inventive concept, the second spacer 210 may have a cross-section taken along the third direction having a horseshoe shape convex toward a central portion of the gate structure 310 in the first direction.

In an example embodiment of the present inventive concept, a first thickness Ti of the first spacer 185 in the first direction, which may be a maximum thickness of the first spacer 185 in the first direction, may be substantially equal to a second thickness T2 in the first direction of a central portion of the second spacer 210 in the third direction, however, the present inventive concept may not be limited thereto. For example, in an example embodiment of the present inventive concept, the second thickness T2 in the first direction of a central portion of the second spacer 210 in the third direction may be larger than the first thickness Ti of the first spacer 185 in the first direction.

Due to the characteristics of the formation process of the second spacer 210, the third length L3 of the lower portion of the gate structure 310 and the second thickness T2 of the second spacer 210 may be in a trade-off relationship. Thus, as the third length L3 decreases, the second thickness T2 may increase, and as a result, the parasitic capacitance between the gate structure 310 and the epitaxial layer 240 may decrease. As described above, the third length L3 of the lower portion of the gate structure 310 may be less than at least the first length L1 of the upper portion of the gate structure 310, and thus the second thickness T2 of the second spacer 210 may have a relatively large value, and the parasitic capacitance between the gate structure 310 and the epitaxial layer 240 may have a relatively small value. In addition, the combination of the second spacer 210 and the air gap 230 may further reduce the parasitic capacitance between the gate structure 310 and the epitaxial layer 240.

The first spacer 185 may include a nitride, e.g., silicon nitride ($Si_3N_4$), and the second spacer 210 may include a nitride, e.g., silicon nitride ($Si_3N_4$), silicon carbonitride (SiCN), silicon boronitride (SiBN), silicon oxycarbonitride (SiOCN), etc.

The insulation layer 250 may surround the sidewall of the first spacer 185 to cover the epitaxial layer 240. The insulation layer 250 may include an oxide, e.g., silicon oxide ($SiO_2$).

The semiconductor device may further include contact plugs, wirings, etc., electrically connected to the epitaxial layer 240 and/or the gate structure 310.

As illustrated above, in the semiconductor device in accordance with an example embodiment of the present inventive concept, the lower portion of the gate structure 310 may have a length less than that of the upper portion of the gate structure 310, and thus a thickness of the second spacer 210 covering the sidewall of the lower portion of the gate structure 310 may have a large value. Accordingly, the parasitic capacitance between the gate structure 310 and the epitaxial layer 240 may be reduced. In addition, the existence of the air gap 230 may further reduce the parasitic capacitance between the gate structure 310 and the epitaxial layer 240. Thus, in the MBCFET in accordance with an example embodiment of the present inventive concept, the parasitic capacitance between the gate structure 310 surrounding the vertically stacked channels (the semiconductor patterns 124) and the source/drain layer (the epitaxial layer 240) may be reduced to provide better electrical characteristics for the MBCFET.

FIGS. 6 to 21 are plan views and cross-sectional views illustrating a method of manufacturing a semiconductor device in accordance with an example embodiment of the present inventive concept. FIGS. 6, 8, 10, and 14 are the plan views, FIGS. 7, 9, 11-13, and 15-21 are the cross-sectional views.

Figure 6:
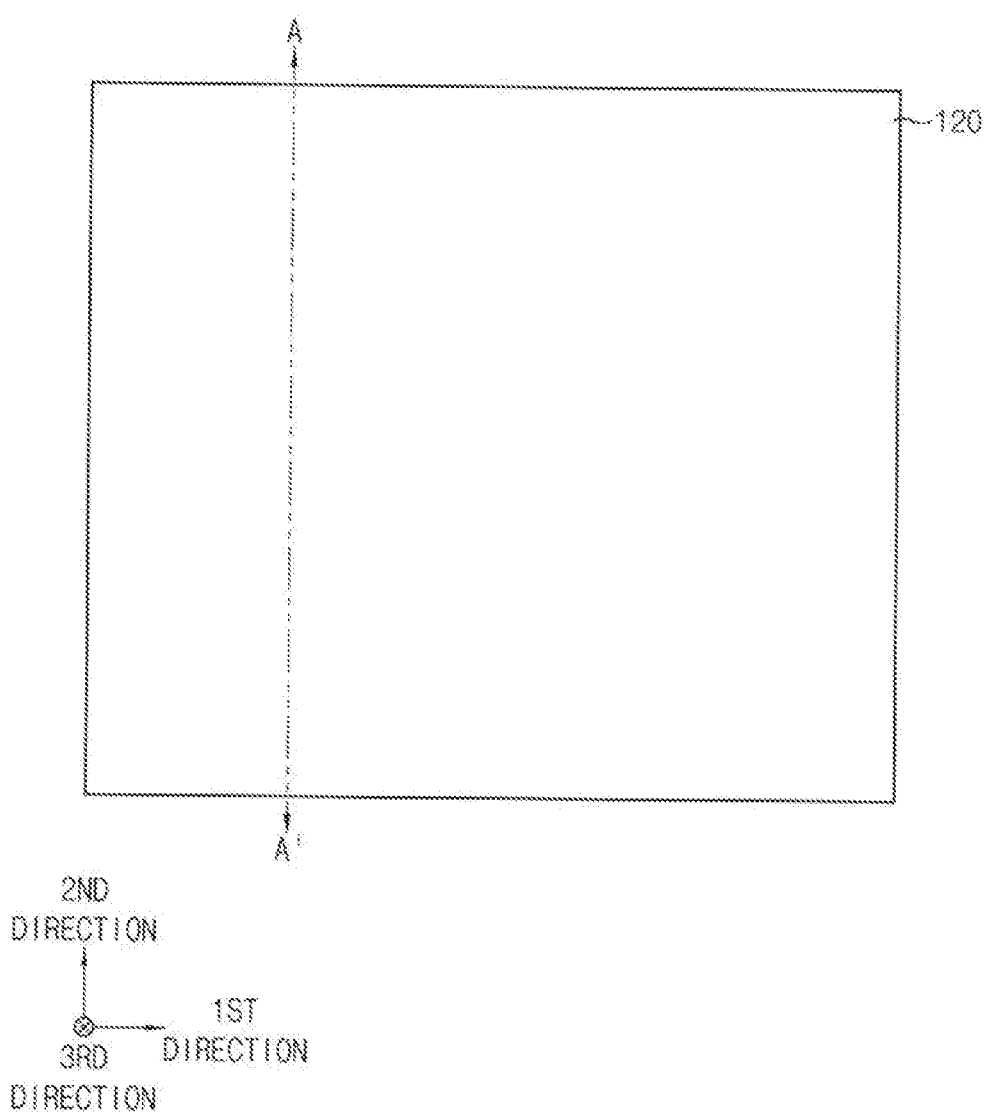
Figure 8:
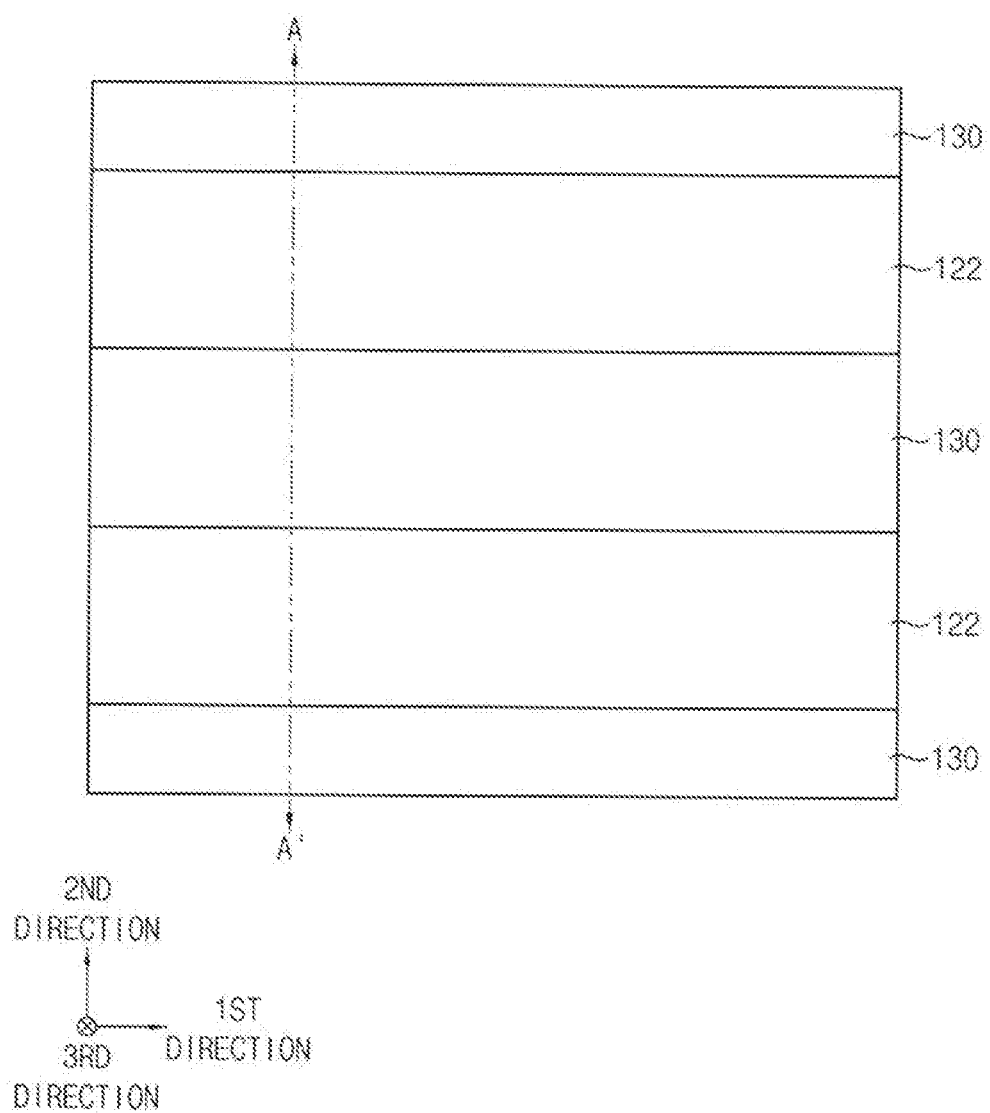
Figure 10:
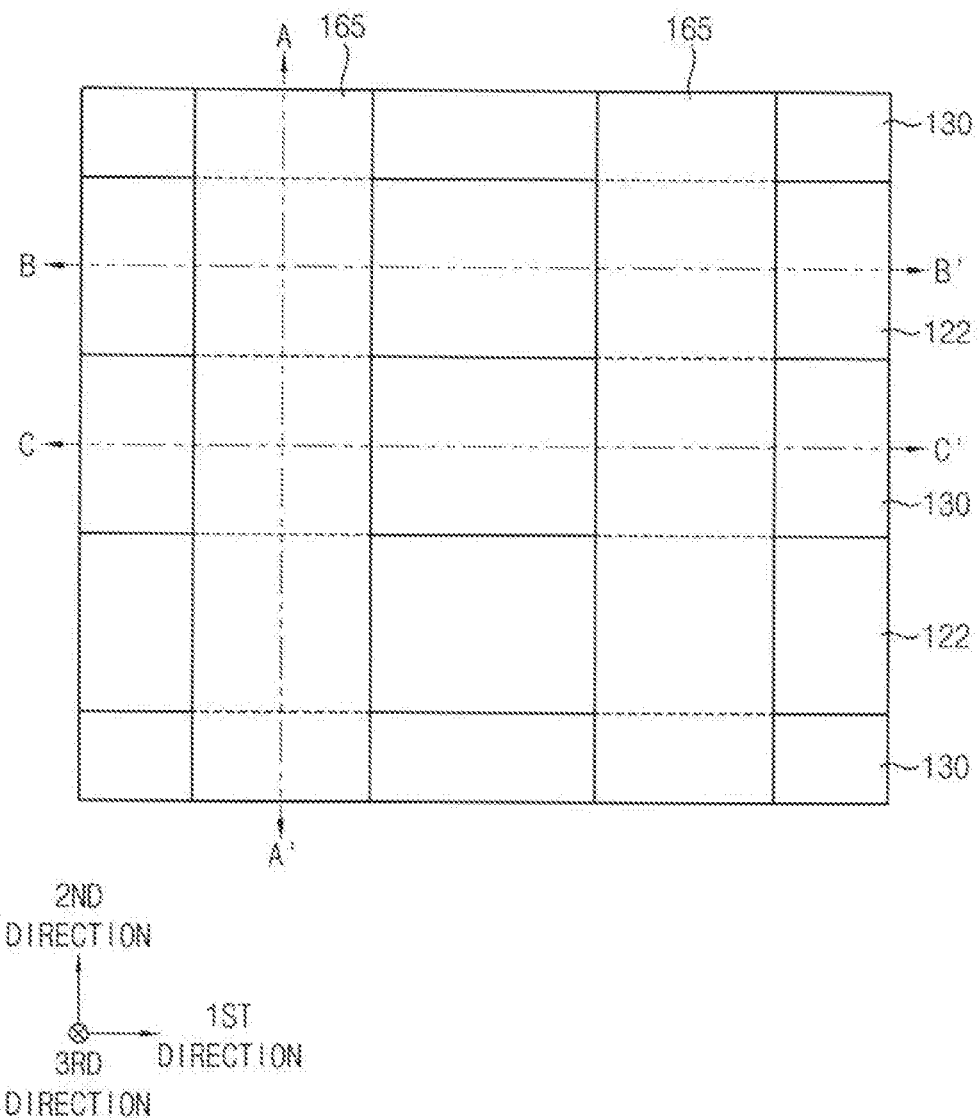
Figure 11:
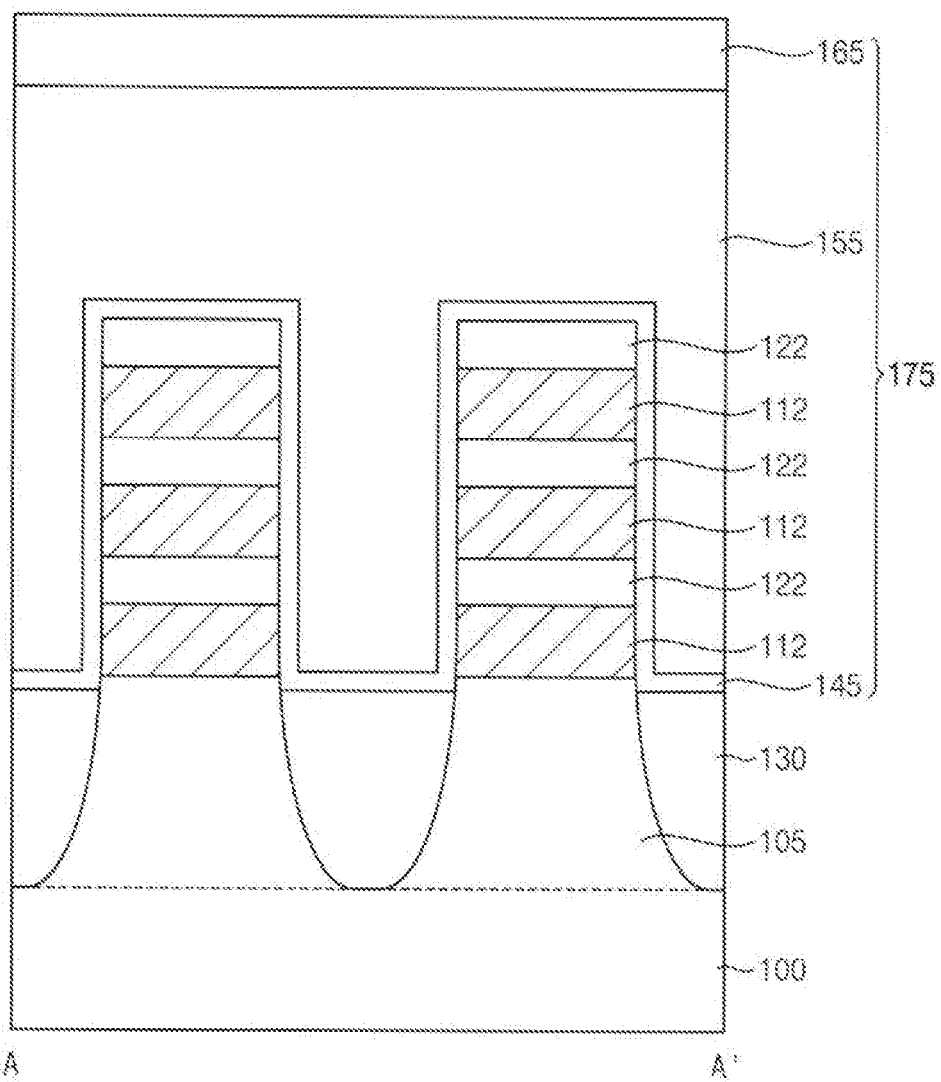
Figure 12:
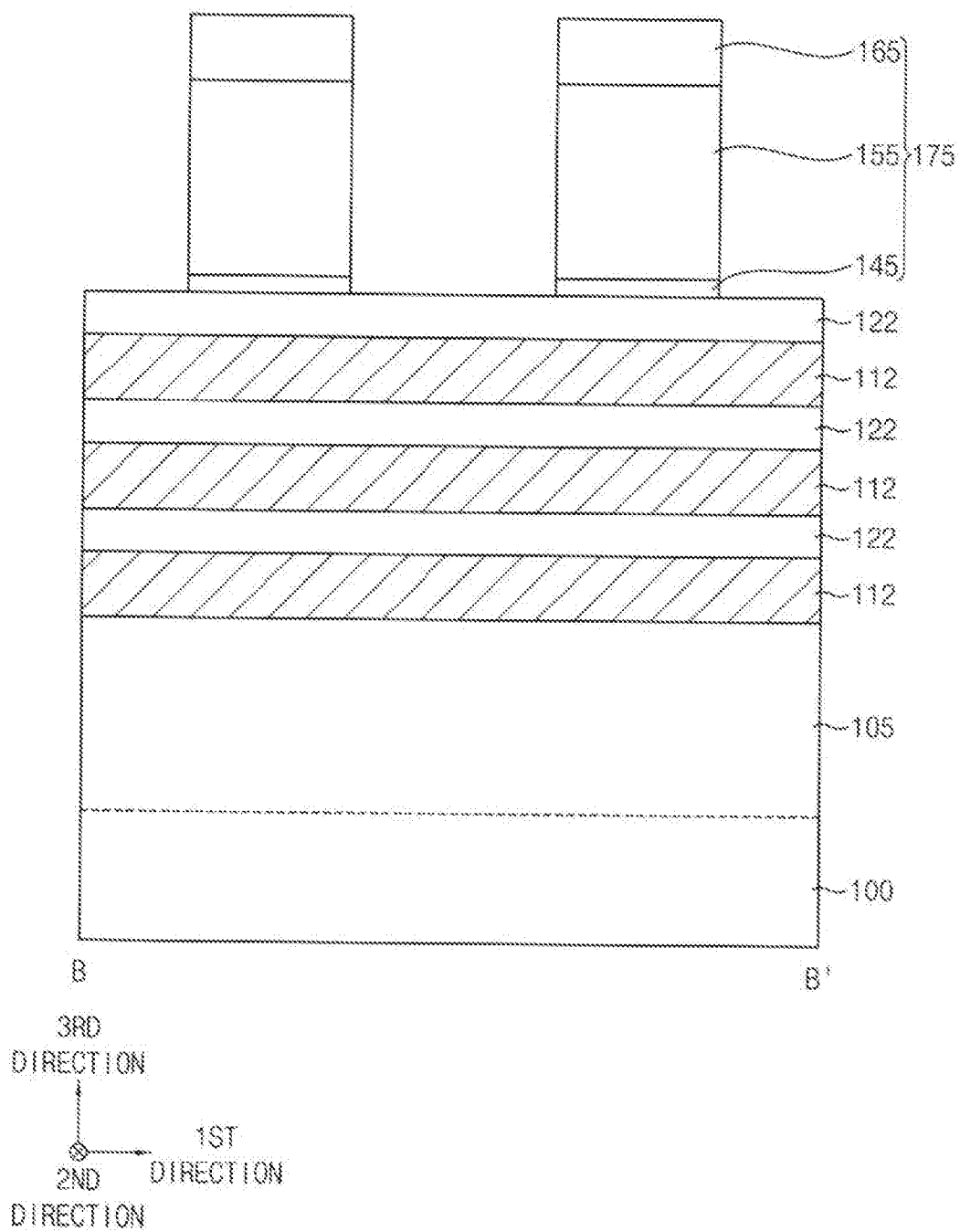
Figure 13:
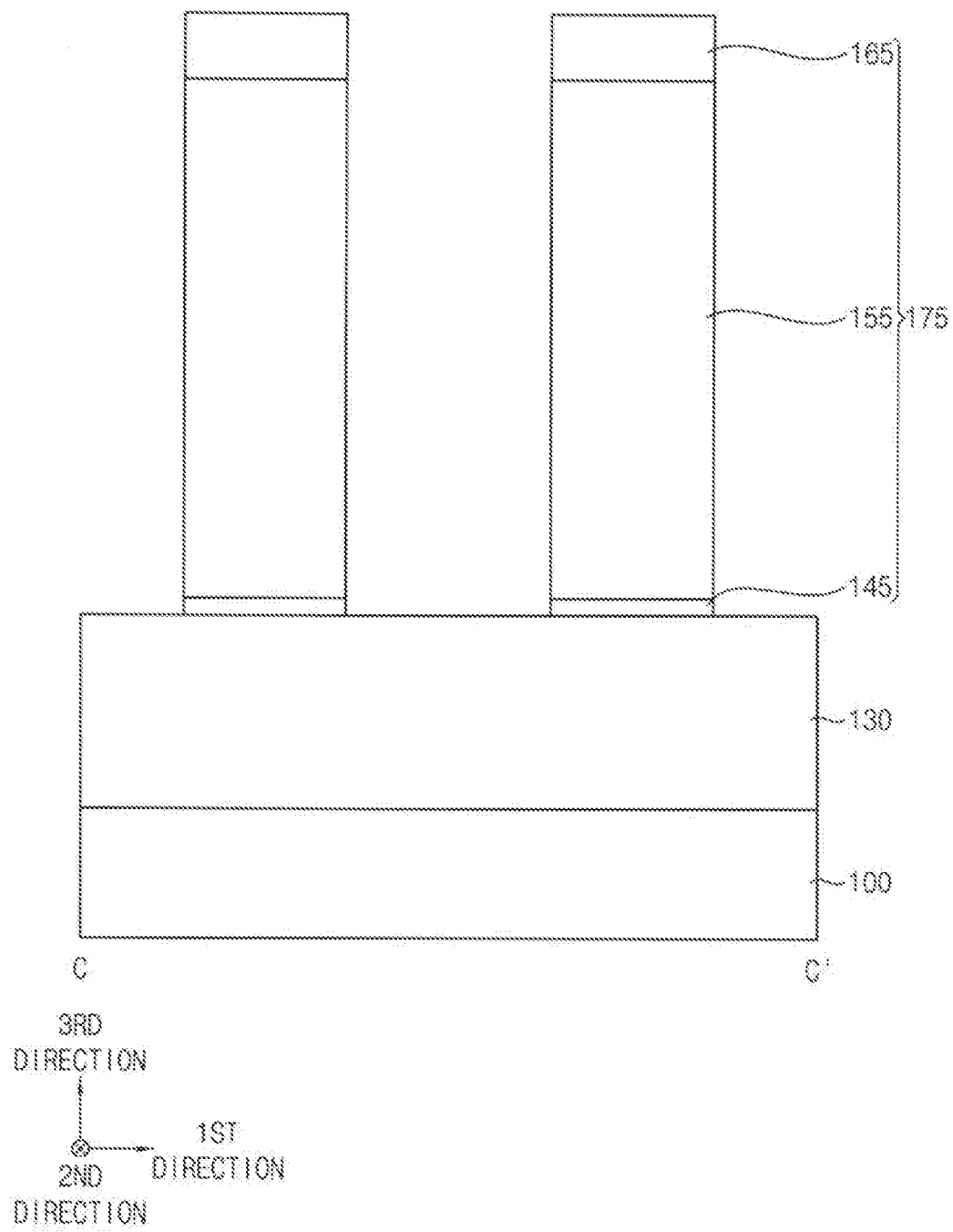

FIGS. 7, 9 and 11 are cross-sectional views taken along lines A-A' of corresponding plan views, in which the corresponding plan views may include FIGS. 6, 8 and 10. FIGS. 12, 15 and 17-20 are cross-sectional views taken along lines B-B' of corresponding plan views, in which the corresponding plan views may include at least FIGS. 10 and 14. FIGS. 13, 16 and 21 are cross-sectional views taken along lines C-C' of corresponding plan views, in which the corresponding plan views may include at least FIGS. 10 and 14.

Referring to FIGS. 6 and 7, sacrificial layers 110 and semiconductor layers 120 may be alternately stacked on a substrate 100.

In the figures, three sacrificial layers 110 and three semiconductor layers 120 are shown to be formed on the substrate 100, however, the present inventive concept may not be limited thereto. In general, more than one sacrificial layer 110 and more than one semiconductor layer 120 may be required for forming the MBCFET. For example, two or more sacrificial layers 110 and two or more semiconductor layers 120 may be formed on the substrate 100 for forming the MBCFET.

The sacrificial layer 110 may include a material having an etching selectivity with respect to the substrate 100 and the semiconductor layer 120, which may include, e.g., silicon-germanium (SiGe).

Referring to FIGS. 8 and 9, a hard mask may be formed on an uppermost one of the semiconductor layers 120 to extend in the first direction, and the semiconductor layers 120, the sacrificial layers 110, and an upper portion of the substrate 100 may be etched using the hard mask as an etching mask. Thus, an active region 105 may be formed on the substrate 100 to extend in the first direction, and a fin structure including sacrificial lines 112 and semiconductor lines 122 alternately and repeatedly stacked may be formed on the active region 105. The hard mask may be formed by a photolithography process. The etching process may be an anisotropic etching process, e.g., a reactive ion etching (RIE) process. In an example embodiment of the present inventive concept, a plurality of fin structures may be formed to be spaced apart from each other in the second direction on the substrate 100.

After removing the hard mask, an isolation pattern 130 may be formed on the substrate 100 to cover a sidewall of the active region 105.

Referring to FIGS. 10 to 13, a dummy gate structure 175 may be formed on the substrate 100 to partially cover the fin structure and the isolation pattern 130.

To form the dummy gate structure 175, a dummy gate insulation layer, a dummy gate electrode layer, and a dummy gate mask layer may be sequentially formed on the substrate 100 having the fin structure and the isolation pattern 130 thereon, a photoresist pattern may be formed on the dummy gate mask layer, and the dummy gate mask layer may be etched using the photoresist pattern as an etching mask to form a dummy gate mask 165. The photoresist pattern may be formed by a photolithography process.

The dummy gate insulation layer may include an oxide, e.g., silicon oxide ($SiO_2$), the dummy gate electrode layer may include, e.g., polysilicon, and the dummy gate mask layer may include a nitride, e.g., silicon nitride ($Si_3N_4$).

The dummy gate electrode layer and the dummy gate insulation layer may be etched using the dummy gate mask 165 as an etching mask to form a dummy gate electrode 155 and a dummy gate insulation pattern 145, respectively.

The dummy gate insulation pattern 145, the dummy gate electrode 155, and the dummy gate mask 165 sequentially stacked on the active region 105 and a portion of the isolation pattern 130 adjacent thereto may form the dummy gate structure 175. In an example embodiment of the present inventive concept, the dummy gate structure 175 may extend in the second direction to cover an upper surface and opposite sidewalls in the second direction of the fin structure and a portion of the isolation pattern 130 adjacent the fin structure in the second direction.

Figure 14:
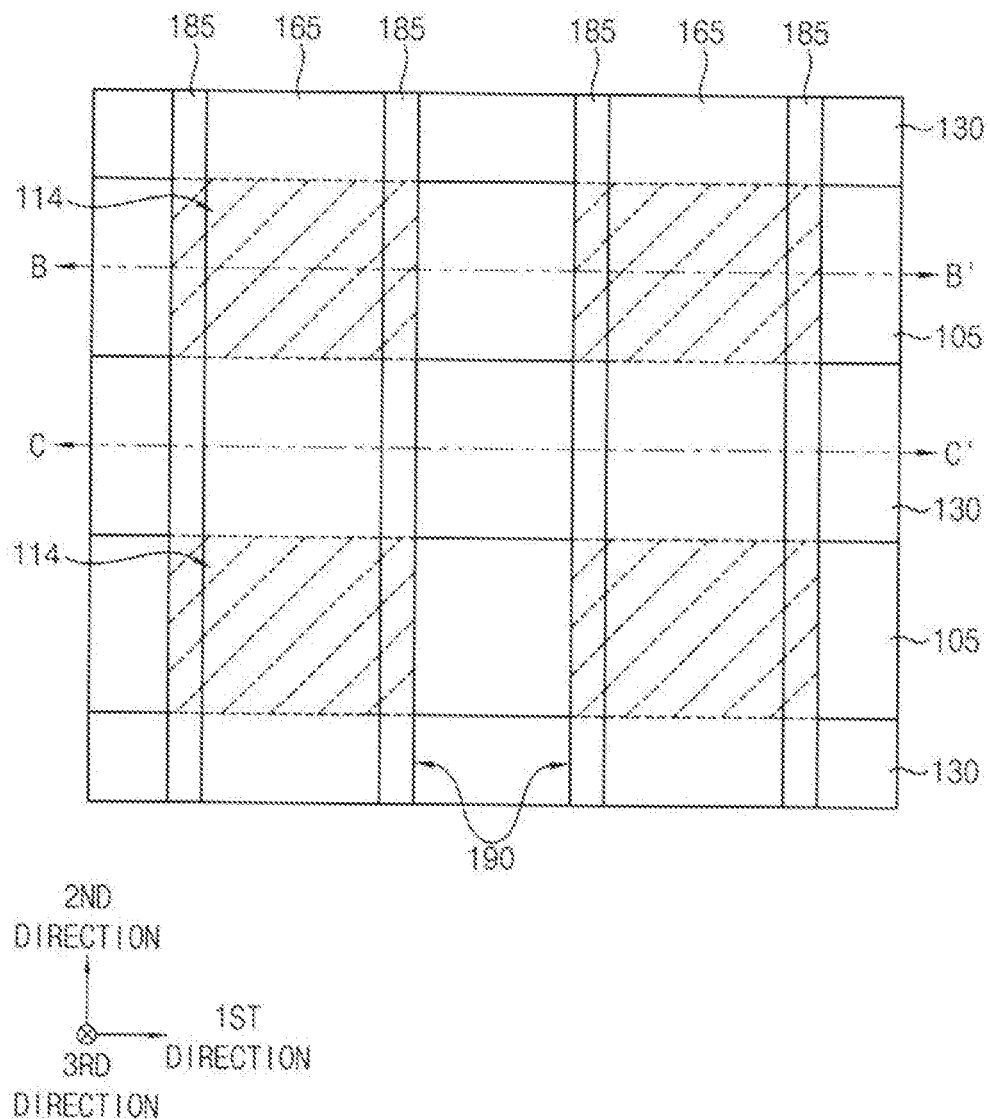
Figure 15:
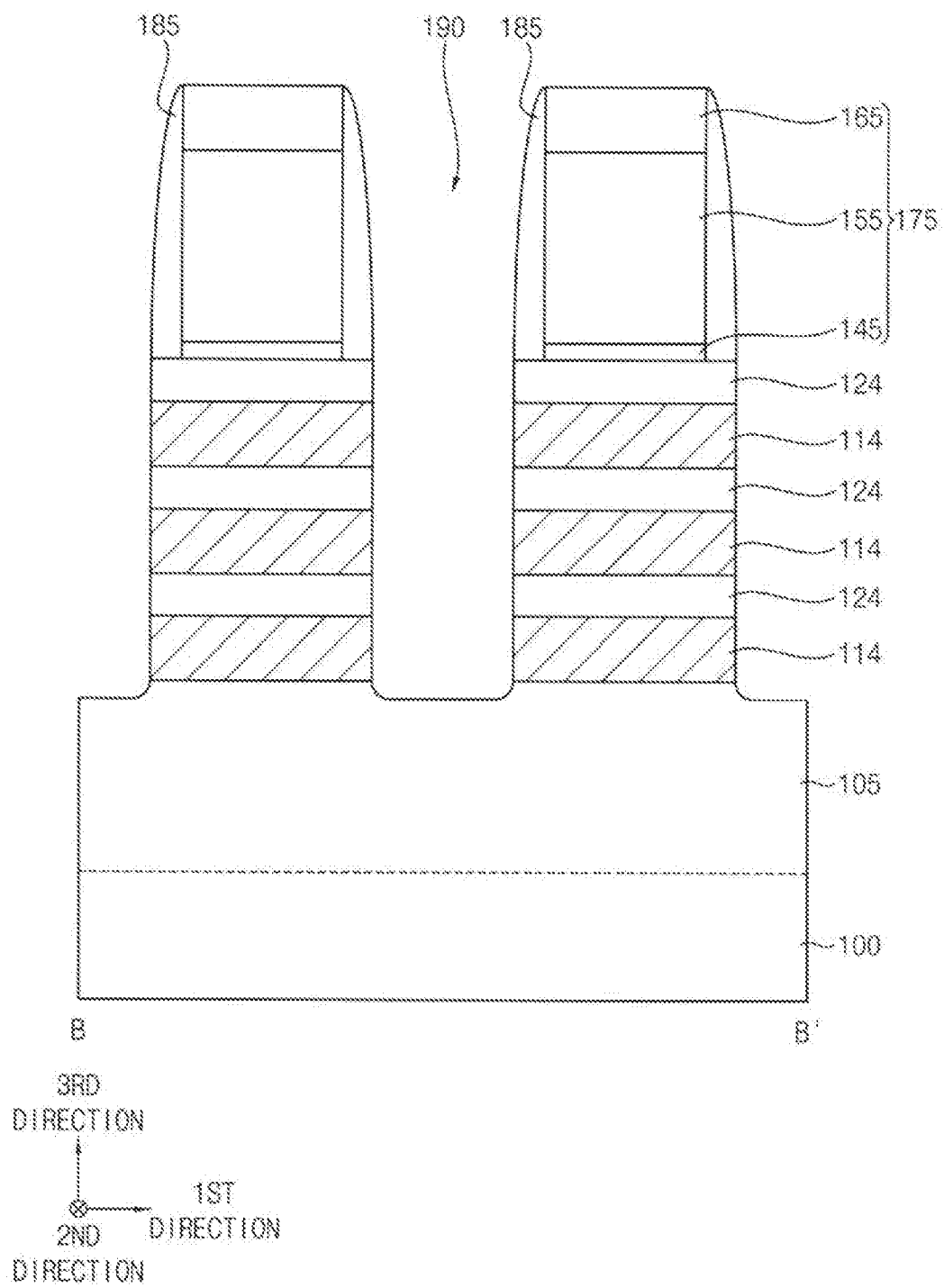
Figure 16:
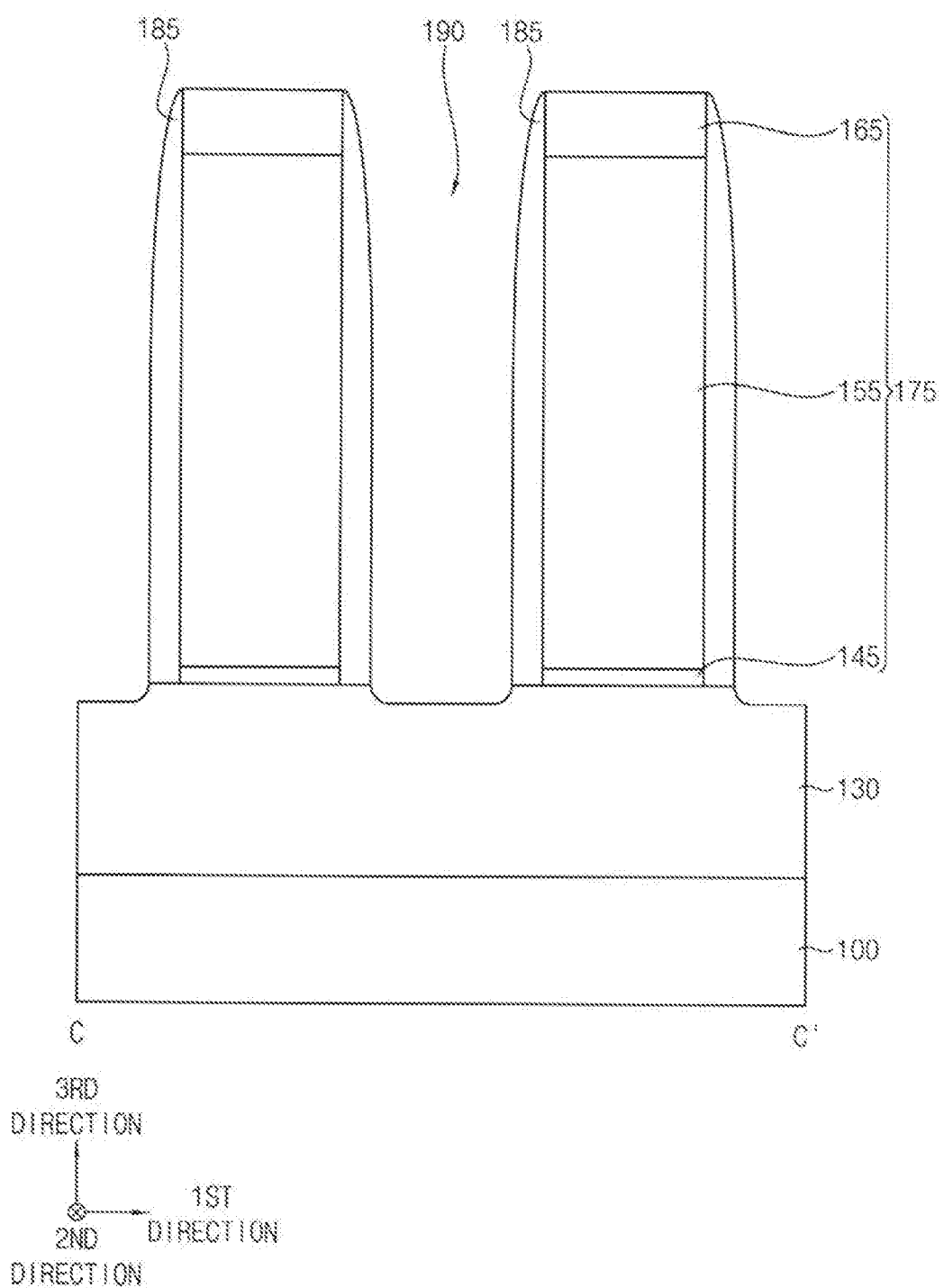

Referring to FIGS. 14 to 16, a first spacer 185 may be formed on a sidewall of the dummy gate structure 175. Particularly, a first spacer layer may be formed on the substrate 100 having the fin structure, the isolation pattern 130, and the dummy gate structure 175 thereon, and may be anisotropically etched to form the first spacer 185 covering each of opposite sidewalls of the dummy gate structure 175 in the first direction. The first spacer layer may be formed by a deposition process, e.g., a chemical vapor deposition (CVD) process, an atomic layer deposition (ALD) process, etc., and may be conformally coated on the exposed top surfaces and sidewall surfaces of the fin structure, the isolation pattern 130, and the dummy gate structure 175. The anisotropic etching process may remove the first spacer layer from the top surfaces of the fin structure, the isolation pattern 130, and the dummy gate structure 175.

The fin structure may be etched using the dummy gate structure 175 and the first spacer 185 as an etching mask to expose an upper surface of the active region 105 of the substrate 100. Thus, the sacrificial lines 112 and the semiconductor lines 122 under the dummy gate structure 175 and the first spacer 185 may be transformed into sacrificial patterns 114 and semiconductor patterns 124, respectively, and the fin structure may be divided into a plurality of parts spaced apart from each other in the first direction. In an example embodiment of the present inventive concept, each of the semiconductor patterns 124 may serve as a channel of a transistor.

Hereinafter, the dummy gate structure 175, the first spacer 185 on each of opposite sidewalls of the dummy gate structure 175, and the fin structure under the dummy gate structure 175 and the first spacer 185 may be referred to as a first structure. In an example embodiment of the present inventive concept, the first structure may extend in the second direction, and a plurality of first structures may be formed to be spaced apart from each other in the first direction. A first opening 190 may be formed between the first structures to expose the active region 105 and the isolation pattern 130.

Figure 17:
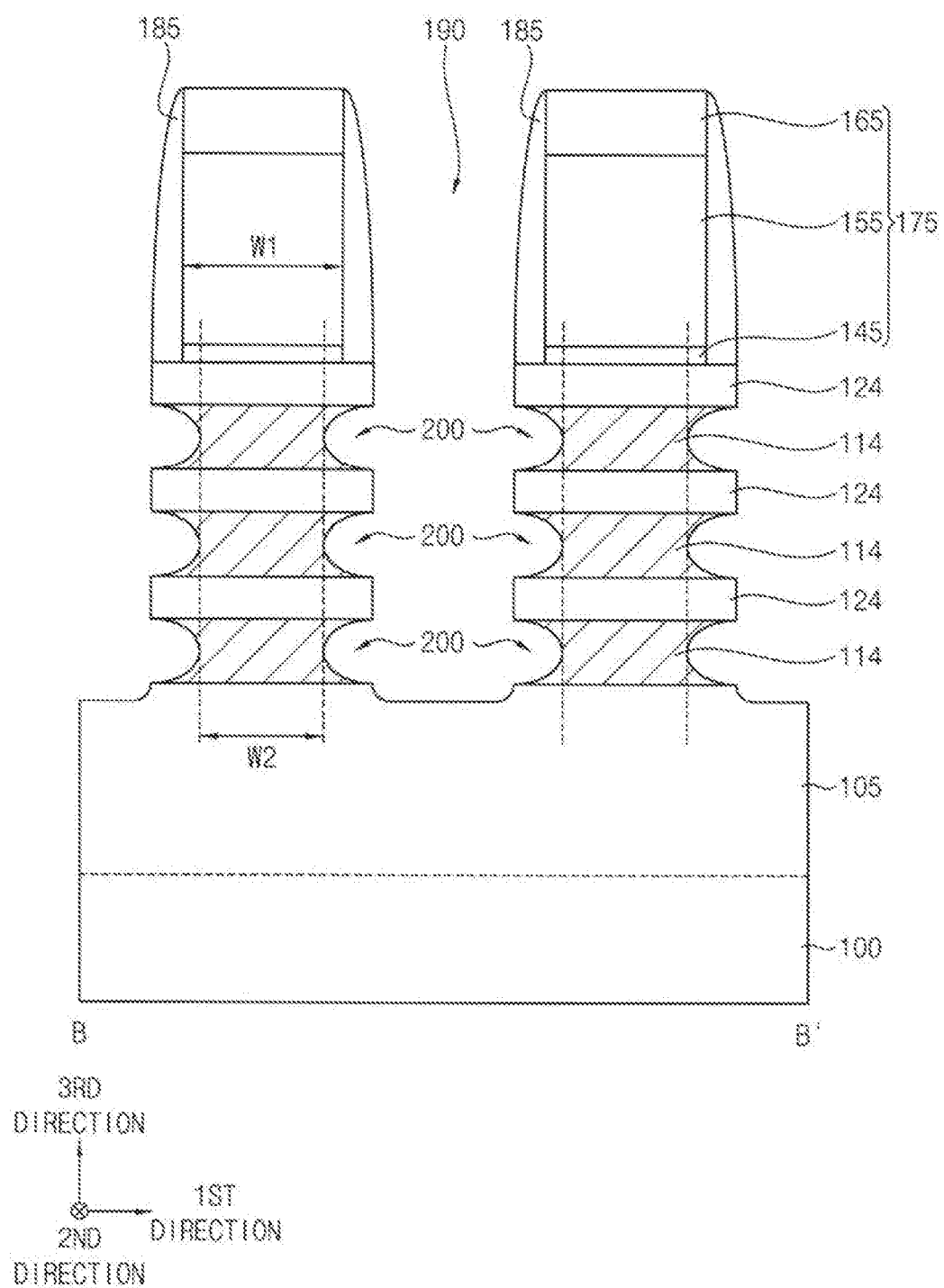

Referring to FIG. 17, opposite sidewalls in the first direction of the sacrificial patterns 114 exposed by the first opening 190 may be isotropically etched to form first recesses 200, respectively.

In an example embodiment of the present inventive concept, the first recesses 200 may be formed by a wet etching process on the sacrificial patterns 114. Thus, each of the first recesses 200 may have a convex shape toward a central portion of each of the sacrificial patterns 114 in the first direction.

The sacrificial pattern 114 having the first recess 200 may have a width in the first direction gradually decreasing from a central portion in the third direction to a top portion or to a bottom portion thereof. That is, the sacrificial pattern 114 may have a length in the first direction gradually increasing from a central portion in the third direction to a top portion or to a bottom portion thereof. In an example embodiment of the present inventive concept, a second width W2 in the first direction of the central portion of the sacrificial pattern 114 may be less than a first width W1 of the dummy gate structure 175 on the sacrificial pattern 114.

Referring to FIG. 18, a second spacer 210 may be formed to fill each of the first recesses 200.

The second spacer 210 may be formed by forming a second spacer layer on the dummy gate structure 175, the first spacer 185, the fin structure, the active region 105 of the substrate 100, and the isolation pattern 130 to fill the first recesses 200, and anisotropically etching the second spacer layer. The second spacer layer may be formed by a deposition process, e.g., a CVD process, an ALD process, etc. In the deposition process, the second spacer layer may be conformally coated on the exposed top surfaces and sidewall surfaces of the dummy gate structure 175, the first spacer 185, the fin structure, the active region 105 of the substrate 100, and the isolation pattern 130. Thus, the coated second spacer layer may follow the contour of these sidewall surfaces, and thus may form new recesses having a convex shape toward the central portion of each of the sacrificial patterns 114 in the first direction after filling the first recesses 200. The anisotropic etching may reduce the size of the new recesses.

In an example embodiment of the present inventive concept, a second recess 220 may be formed on an outer sidewall of the second spacer 210, which may be convex toward the central portion of the sacrificial pattern 114 in the first direction. In an example embodiment of the present inventive concept, a second thickness T2 in the first direction of the central portion of the second spacer 210 in the third direction may be slightly greater than a first thickness Ti of the first spacer 185 in the first direction, in which the first thickness Ti may be a maximum thickness of the first spacer 185 in the first direction, however, the present inventive concept may not be limited thereto. As the second thickness T2 of the second spacer 210 increases, the parasitic capacitance between a gate structure 310 (refer to FIGS. 1 and 3) and an epitaxial layer 240 (refer to FIG. 19) subsequently formed may decrease. In addition, a subsequently formed air gap 230 (refer to FIG. 19) may further reduce the parasitic capacitance between the gate structure 310 and the epitaxial layer 240 (refer to FIG. 19) subsequently formed.

Figure 19:
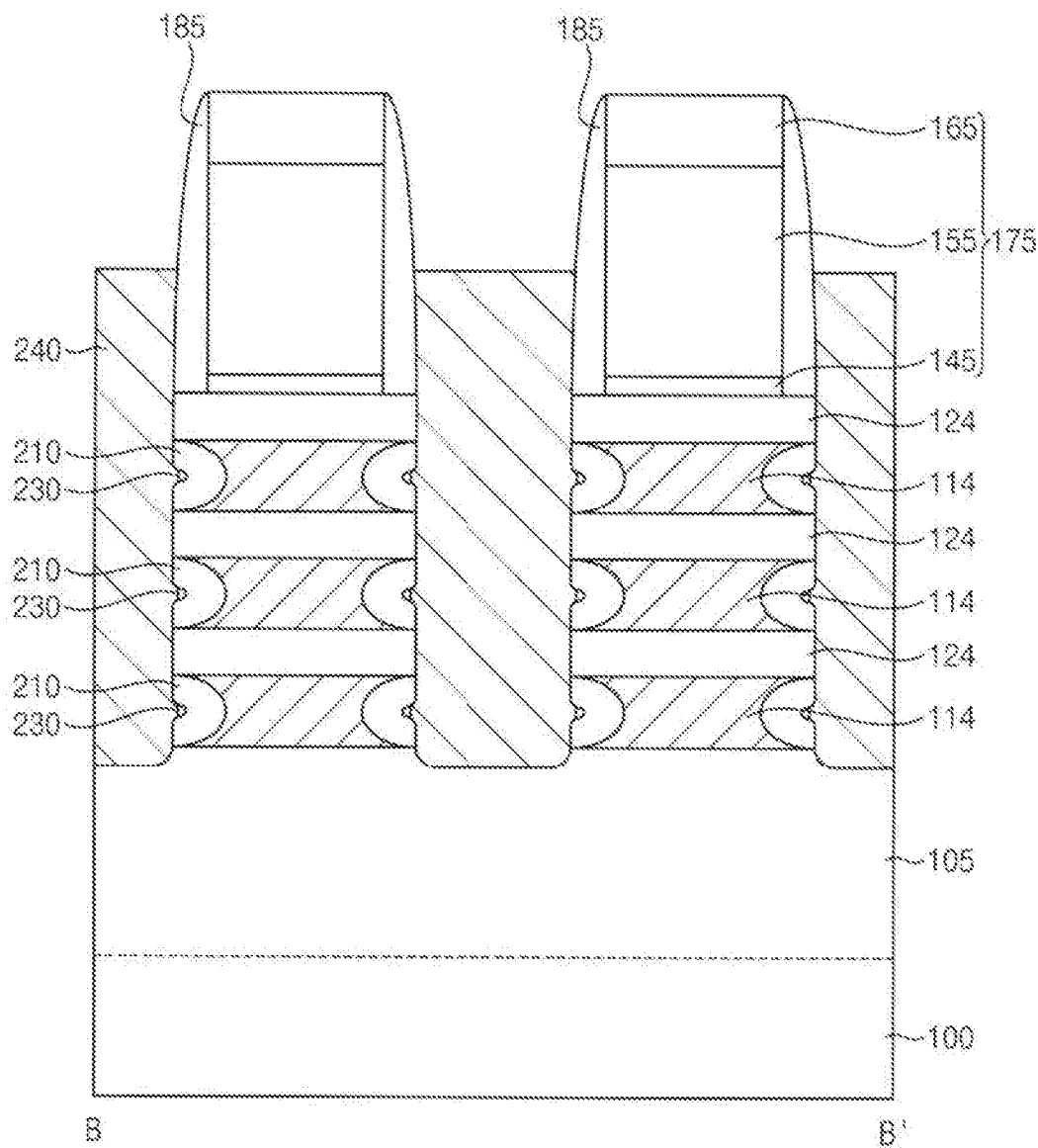

Referring to FIG. 19, an epitaxial layer 240 may be formed on the upper surface of the active region 105 of the substrate 100 exposed by the first opening 190.

In an example embodiment of the present inventive concept, the epitaxial layer 240 may be formed by a selective epitaxial growth (SEG) process using the exposed upper surface of the active region 105 by the first opening 190 as a seed.

In an example embodiment of the present inventive concept, the SEG process may be performed using a silicon source gas such as disilane ($Si_2H_6$) and a carbon source gas such as methylsilane ($SiH_3CH_3$), to form a single crystalline silicon carbide (SiC) layer. In an example embodiment of the present inventive concept, the SEG process may be performed using only the silicon source gas such as disilane ($Si_2H_6$), to form a single crystalline silicon (Si) layer. The epitaxial layer 240 including the single crystalline silicon carbide (SiC) layer or the single crystalline silicon (Si) layer may serve as a source/drain layer of an NMOS transistor. Alternatively, the SEG process may be performed, using a silicon source gas such as dichlorosilane ($SiH_2Cl_2$) and a germanium source gas such as germane ($GeH_4$), to form a single crystalline silicon germanium (SiGe) layer. The epitaxial layer 240 including the single crystalline silicon germanium (SiGe) layer may serve as a source/drain layer of a PMOS transistor.

In an example embodiment of the present inventive concept, the epitaxial layer 240 may be formed on each of opposite sidewalls of the first structure in the first direction. In an example embodiment of the present inventive concept, the epitaxial layer 240 may contact sidewalls of the semiconductor patterns 124 of the fin structure, and outer sidewalls of the second spacer 210 covering sidewalls of the sacrificial patterns 114, and may further grow in the third direction to contact a sidewall of the first spacer 185.

In an example embodiment of the present inventive concept, the epitaxial layer 240 may not completely fill the second recess 220 on the outer sidewall of the second spacer 210 due to the crystallinity, and thus an air gap 230 may be formed between the epitaxial layer 240 and the second spacer 210.

The epitaxial layer 240 may serve as a source/drain layer of a transistor. An impurity doping process and a heat treatment process may be further performed on the epitaxial layer 240. For example, when the epitaxial layer 240 includes silicon carbide or silicon, n-type impurities may be doped thereinto and a heat treatment may be performed. When the epitaxial layer 240 includes silicon-germanium, p-type impurities may be doped thereinto and a heat treatment may be performed. Thus, the epitaxial layer 240 may include single crystalline silicon carbide (SiC) doped with n-type impurities or single crystalline silicon (Si) doped with n-type impurities, and thus may serve as a source/drain layer of an NMOS transistor. Alternatively, the epitaxial layer 240 may include single crystalline silicon-germanium (SiGe) doped with p-type impurities, and thus may serve as a source/drain layer of a PMOS transistor.

Figure 20:
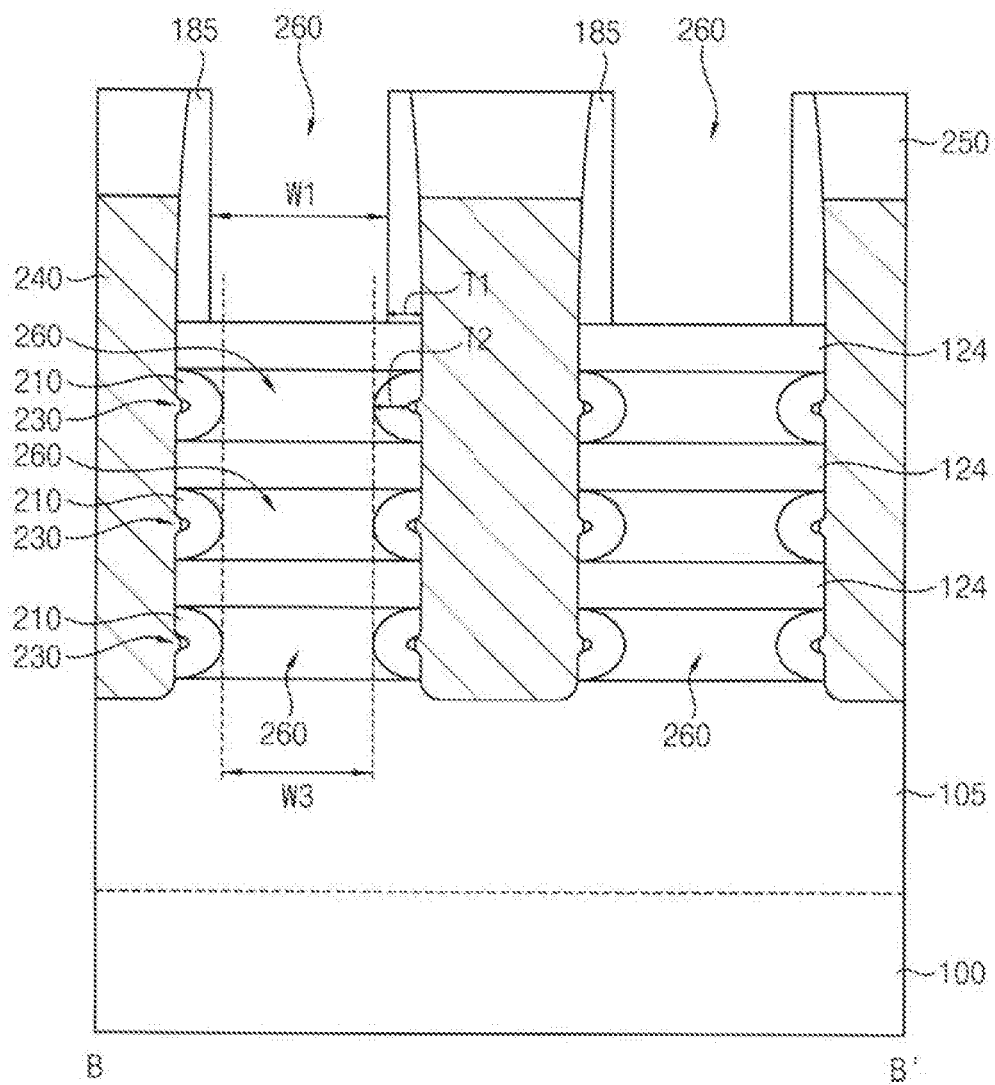
Figure 21:
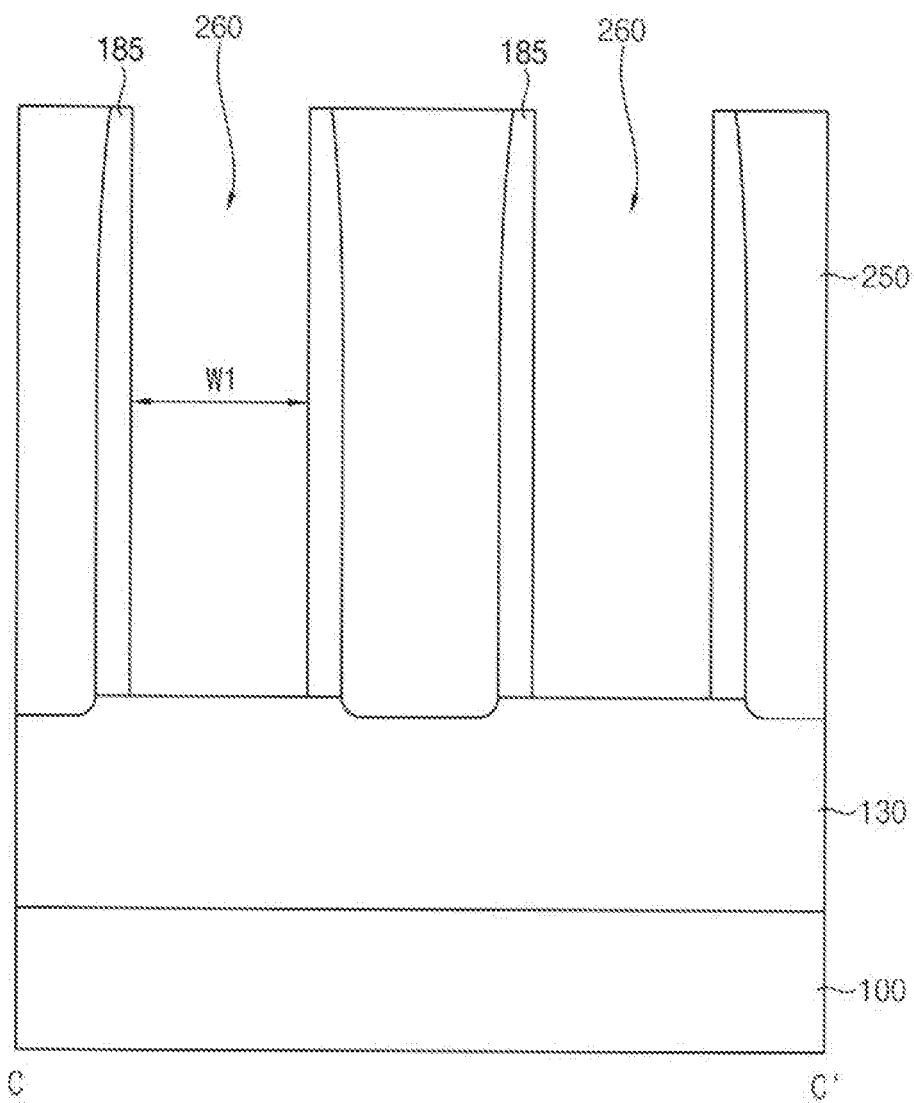

Referring to FIG. 20, an insulation layer 250 may be formed on the substrate 100 to cover the first structure and the epitaxial layer 240, and may be planarized until an upper surface of the dummy gate electrode 155 of the first structure is exposed. During the planarization process, the dummy gate mask 165 may also be removed, and an upper portion of the second spacer 185 may be removed.

The planarization process may be performed by a chemical mechanical polishing (CMP) process and/or an etch back process.

The exposed dummy gate electrode 155 and the dummy gate insulation pattern 145 and the sacrificial patterns 114 thereunder may be removed by, e.g., a wet etching process and/or a dry etching process to form a second opening 260 exposing an inner sidewall of the first spacer 185, an inner sidewall of the second spacer 210, surfaces of the semiconductor patterns 124, and the upper surface of the active region 105.

In an example embodiment of the present inventive concept, when the sacrificial patterns 114 are removed, a portion of the second spacer 210 contacting the sacrificial patterns 114, for example, a central portion of the second spacer 210 in the third direction may also be partially removed, and thus the second thickness T2 of the second spacer 210 may decrease. In an example embodiment of the present inventive concept, after removing the sacrificial patterns 114, the second thickness T2 of the second spacer 210 may be substantially equal to the first thickness Ti of the first spacer 185, however, the present inventive concept may not be limited thereto. For example, in an example embodiment of the present inventive concept, the second thickness T2 of the second spacer 210 may be greater than the first thickness Ti of the first spacer 185 after removing the sacrificial patterns 114.

After removing the sacrificial patterns 114, a third width W3 between inner sidewalls of opposite second spacers 210 in the first direction, which may be a minimum width between the inner sidewalls of opposite second spacers 210 in the first direction, may be less than the first width W1 of the second opening 260 between inner sidewalls of opposite first spacers 185 in the first direction.

Referring to FIGS. 1 to 5 again, a gate structure 310 may be formed on the substrate 100 to fill the second opening 260. Particularly, after a thermal oxidation process is performed on the upper surface of the active region 105 and the surface of the semiconductor pattern 124 exposed by the second opening 260 to form an interface pattern 270, a gate insulation layer and a workfunction control layer may be sequentially formed on a surface of the interface pattern 270, inner sidewalls of the first and second spacers 185 and 210, and an upper surface of the insulation layer 250, and a gate electrode layer may be formed to fill a remaining portion of the second opening 260.

The gate insulation layer, the workfunction control layer, and the gate electrode layer may be formed by, e.g., a CVD process, an ALD process, a physical vapor deposition (PVD) process, etc. The interface pattern 270 may also be formed by a CVD process, an ALD process, a PVD process, etc., instead of the thermal oxidation process, and in this case, the interface pattern 270 may also be formed on the inner sidewalls of the first and second spacers 185 and 210.

The gate electrode layer, the workfunction control layer, and the gate insulation layer may be planarized until the upper surface of the insulation layer 250 is exposed to form a gate electrode 300, a workfunction control pattern 290, and a gate insulation pattern 280, respectively. The planarization process may be performed by a CMP process and/or an etch back process. The interface pattern 270, the gate insulation pattern 280, the workfunction control pattern 290, and the gate electrode 300 may form a gate structure 310.

The semiconductor device may be manufactured by the above processes.

Figure 23:
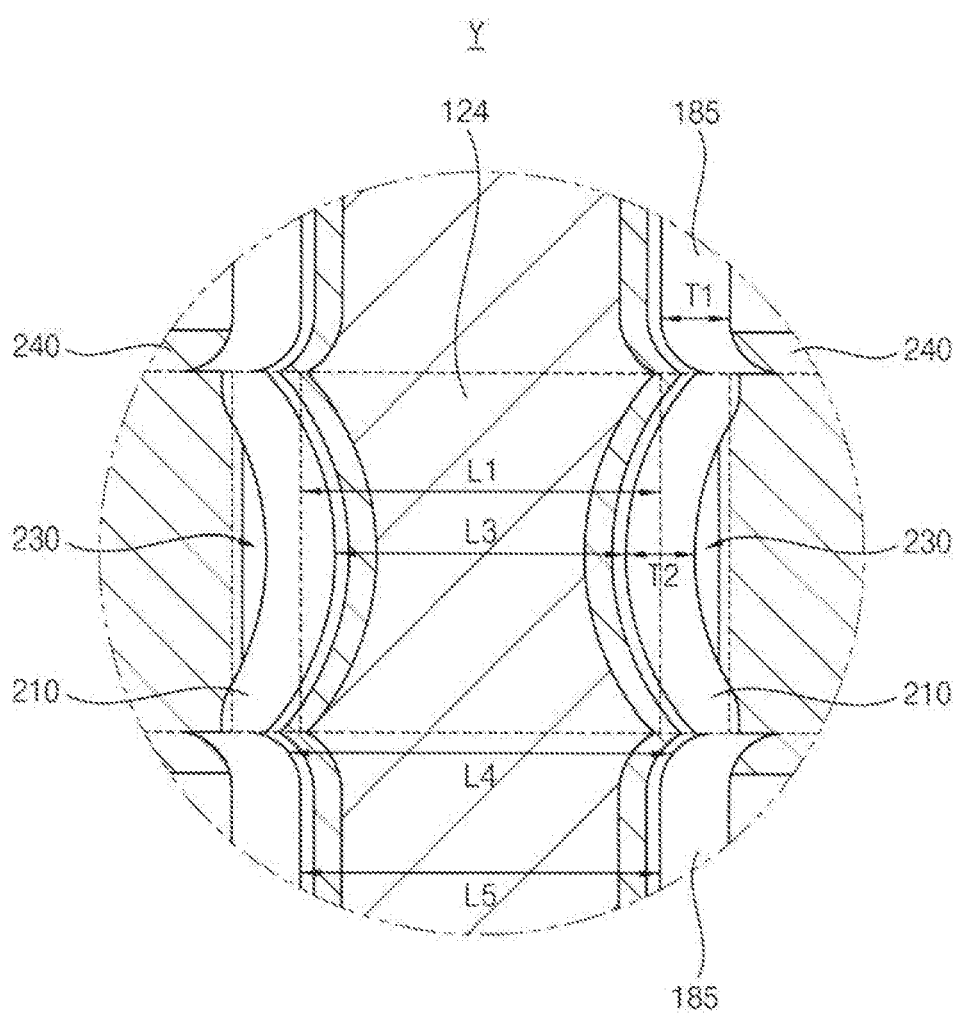
Figure 24:
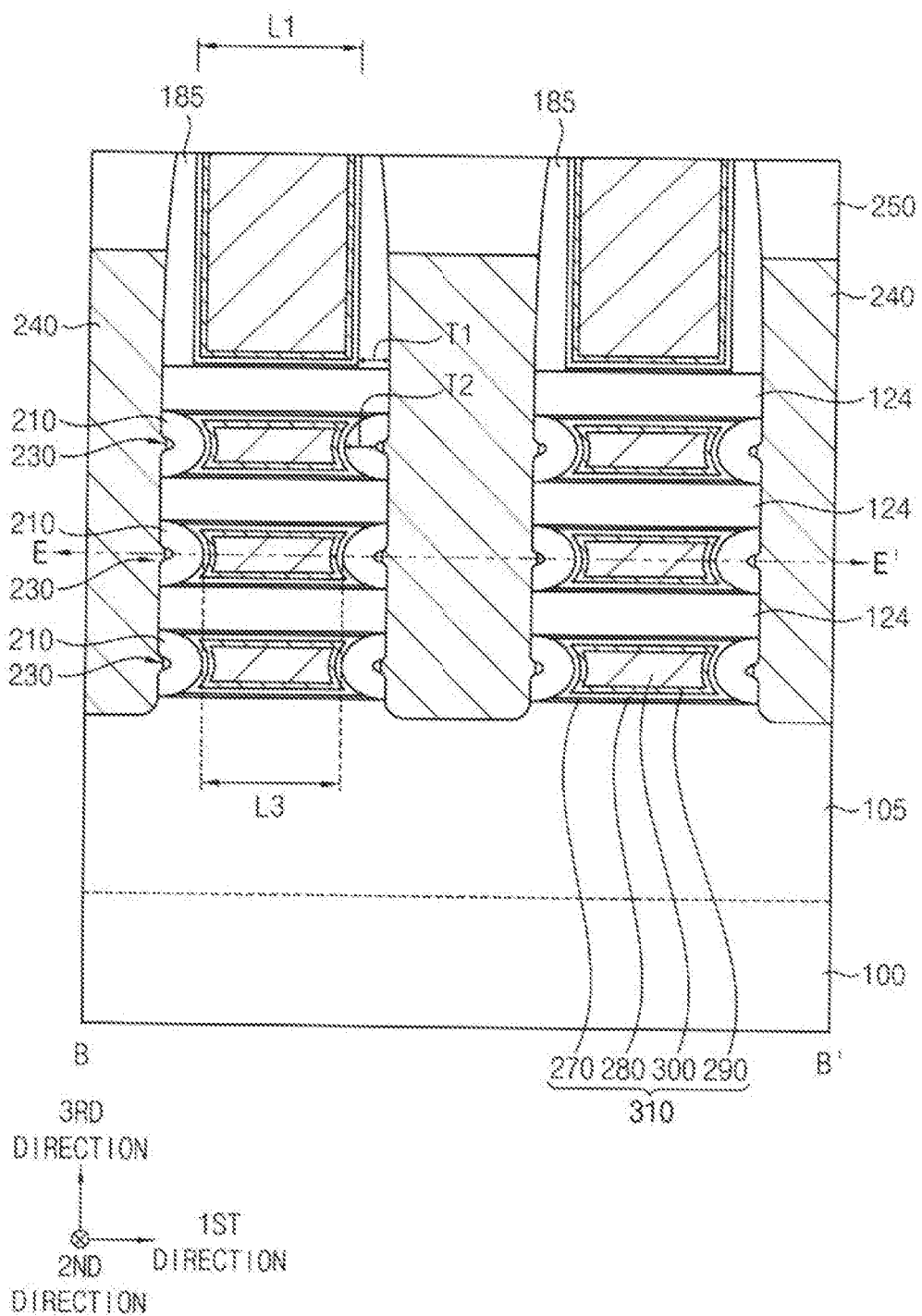
Figure 25:
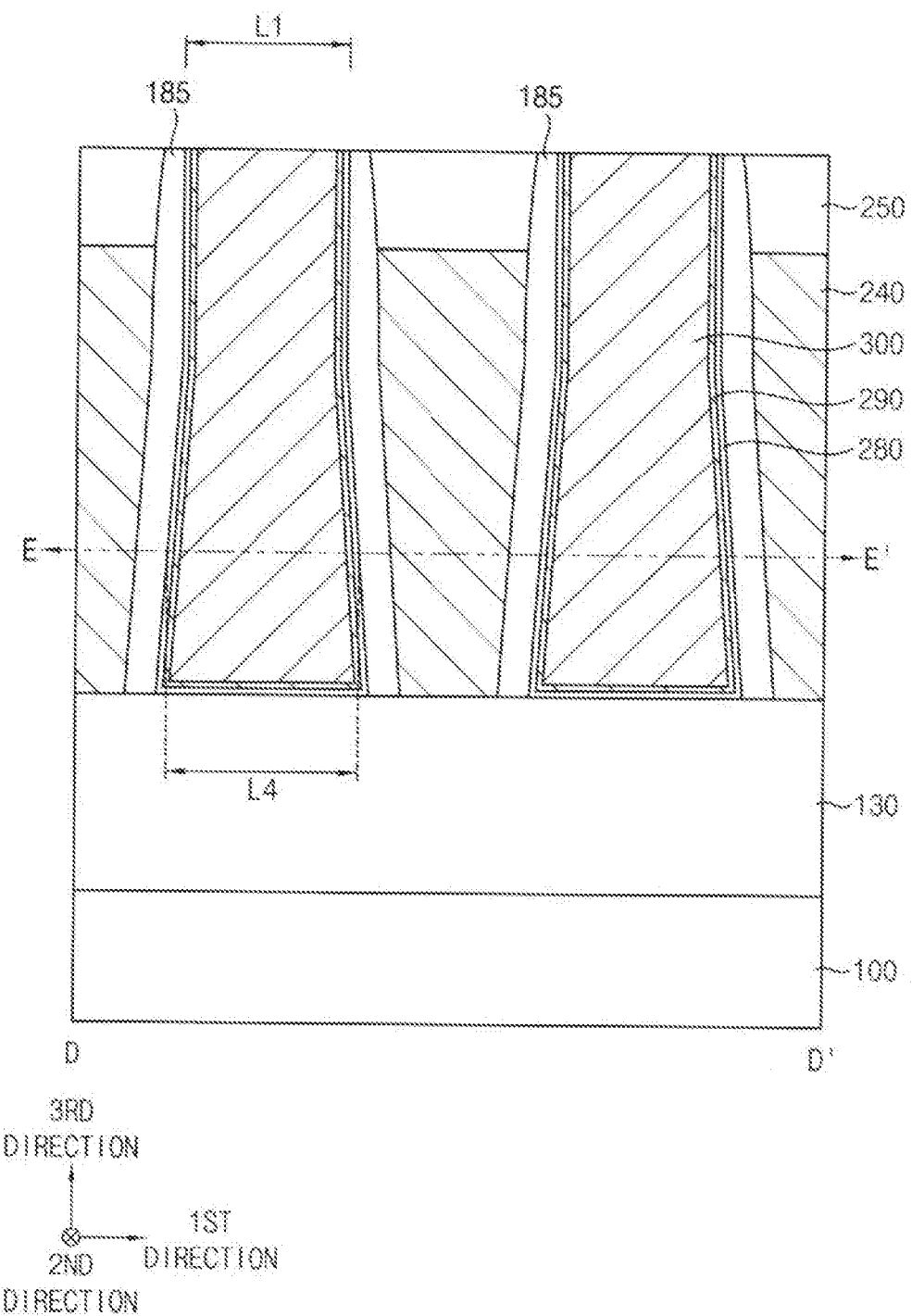

FIGS. 22 to 25 are a plan view and cross-sectional views illustrating a semiconductor device in accordance with an example embodiment of the present inventive concept. FIG. 22 is the plan view, and FIGS. 23 to 25 are the cross-sectional views.

FIGS. 24 and 25 are cross-sectional views taken along lines B-B' and D-D', respectively, of FIG. 22. FIG. 23 is a horizontal cross-sectional view of a region Y of FIG. 22, which may be taken along lines E-E' of FIGS. 24 and 25.

This semiconductor device illustrated in FIGS. 22 to 25 may be substantially the same as that of FIGS. 1 to 5, except for the shapes of the gate structure and the spacer. Thus, like reference numerals refer to like elements, and detailed descriptions thereon are omitted herein.

Referring to FIGS. 22 to 25, a length of the gate structure 310 in the first direction may change along the second direction at a first height lower than that of an upper surface of an uppermost one of the semiconductor patterns 124.

In an example embodiment of the present inventive concept, at the first height, the third length L3 in the first direction of a first portion of the gate structure 310 overlapping the semiconductor pattern 124 in the third direction may be less than a fifth length L5 in the first direction of a second portion of the gate structure 310 not overlapping the semiconductor pattern 124 in the third direction, in which the third length L3 may be a minimum length in the first direction of the first portion of the gate structure 310 overlapping the semiconductor pattern 124 in the third direction, and the fifth length L5 may be a minimum length in the first direction of the second portion of the gate structure 310 not overlapping the semiconductor pattern 124 in the third direction.

In an example embodiment of the present inventive concept, at the first height, a fourth length L4 in the first direction of a third portion in the second portion of the gate structure 310 relatively close to the semiconductor pattern 124 may be greater than a length in the first direction of a fourth portion in the second portion of the gate structure 310 relatively far from the semiconductor pattern 124, i.e., the fifth length L5.

In an example embodiment of the present inventive concept, below the first height, a length in the first direction of the third portion of the gate structure 310 may increase as a height of the third portion of the gate structure 310 decreases. Above the first height, a length in the first direction of the first portion of the gate structure 310 may be substantially constant in the third direction. That is, at a height above the upper surface of the uppermost one of the semiconductor patterns 124 (the channels), the length in the first direction of the first portion of the gate structure is substantially constant along the vertical direction (the third direction). In addition, above the first height, the length of the second portion of the gate structure 310 in the first direction may be substantially constant in the vertical direction (the third direction). Here, above the first height may mean above the upper surface of the uppermost one of the semiconductor patterns 124 (the channels).

In an example embodiment of the present inventive concept, at the first height, the length in the first direction of the first portion of the gate structure 310 may increase as the first portion become closer to the second portion thereof. For example, the length in the first direction of the first portion of the gate structure 310 located near a border between the first portion and the second portion of the gate structure 310 may be larger than that of the first portion of the gate structure 310 located away from the border. As shown in FIG. 23, the third length L3, which is the length of the first portion located away from the border and at about a middle position between two borders, may be the minimum length in the first direction of the first portion of the gate structure 310.

In an example embodiment of the present inventive concept, at the first height, the length in the first direction of the gate structure 310 may periodically change along the second direction.

A portion of the first spacer 185 covering each of opposite sidewalls of the third portion of the gate structure 310 in the first direction may have a slanted sidewall that may not be perpendicular to the upper surface of the substrate 100 below the first height.

In the semiconductor device, the third length L3 in the first direction of the first portion of the gate structure 310 between the semiconductor patterns 124 may be less than the first length L1 of the upper portion of the gate structure 310 and the fourth length L4 of the third portion of the gate structure 310 not overlapping the semiconductor patterns 124 but adjacent thereto. Thus, the second spacer 210 covering the first portion of the gate structure 310 may have a large thickness, and the parasitic capacitance between the gate structure 310 and the epitaxial layer 240 may decrease. In addition, the existence of the air gap 230 may further reduce the parasitic capacitance between the gate structure 310 and the epitaxial layer 240. Thus, in the MBCFET in accordance with an example embodiment of the present inventive concept, the parasitic capacitance between the gate structure 310 surrounding the vertically stacked channels (the semiconductor patterns 124) and the source/drain layer (the epitaxial layer 240) may be reduced to provide better electrical characteristics for the MBCFET.

Figure 29:
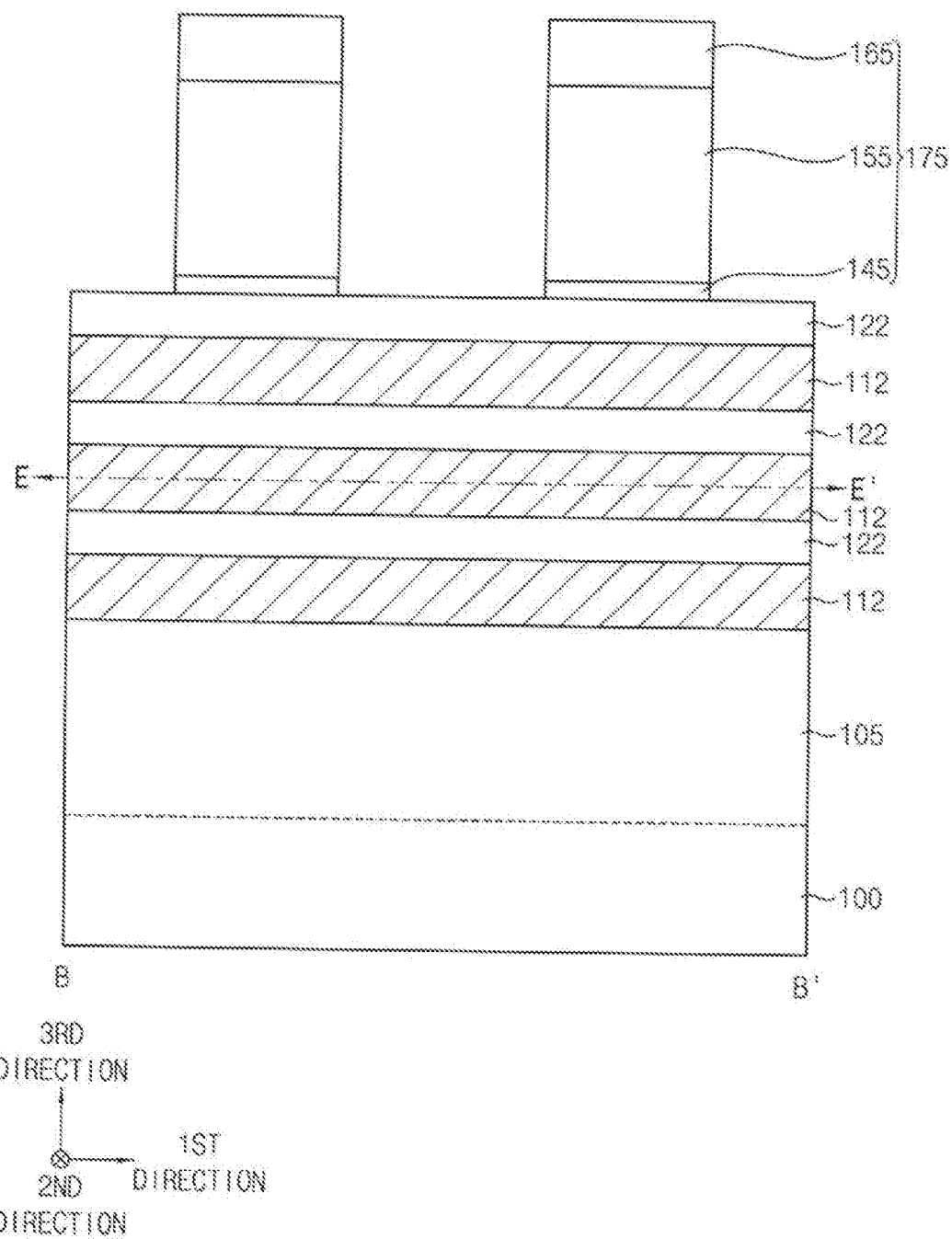
Figure 30:
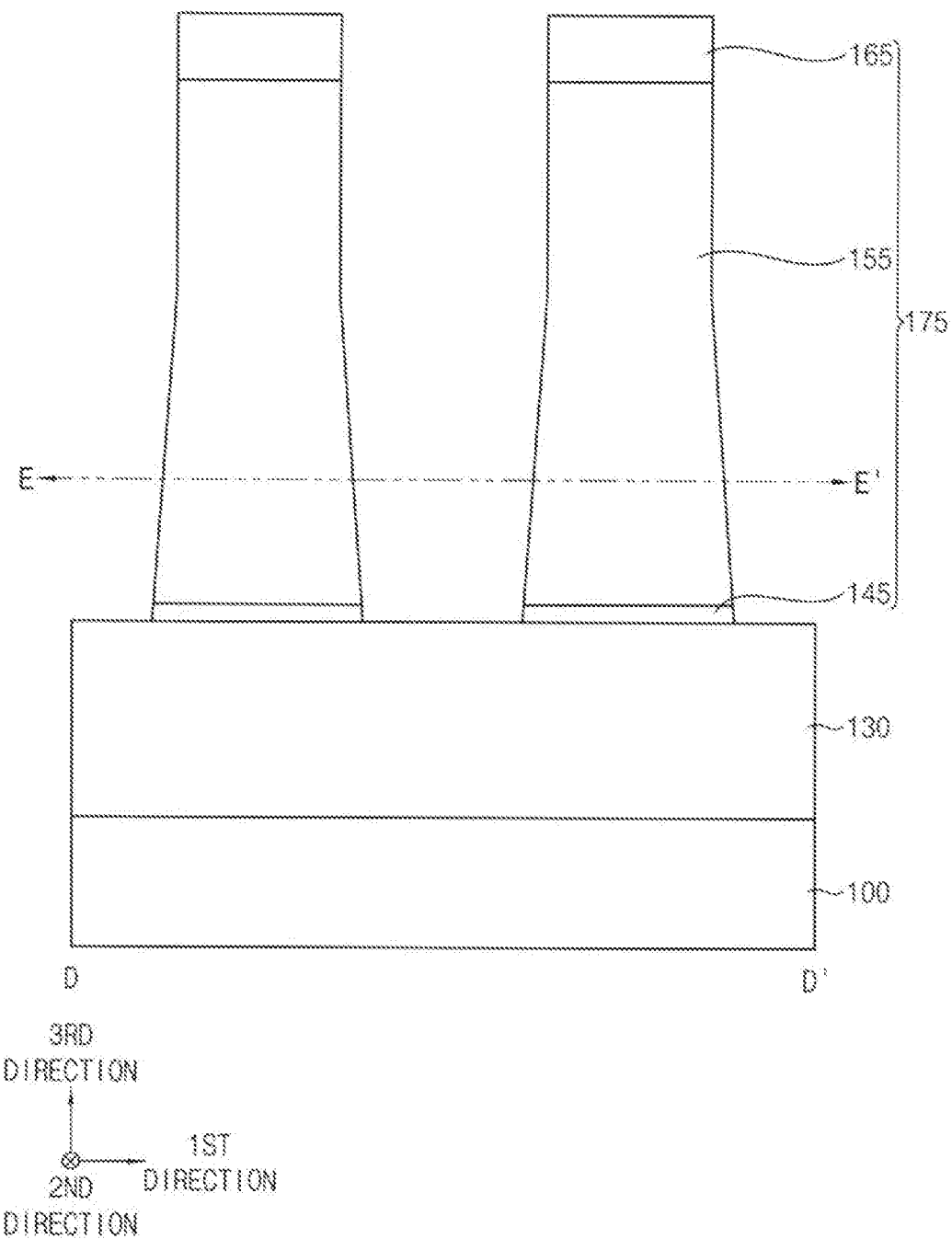
Figure 31:
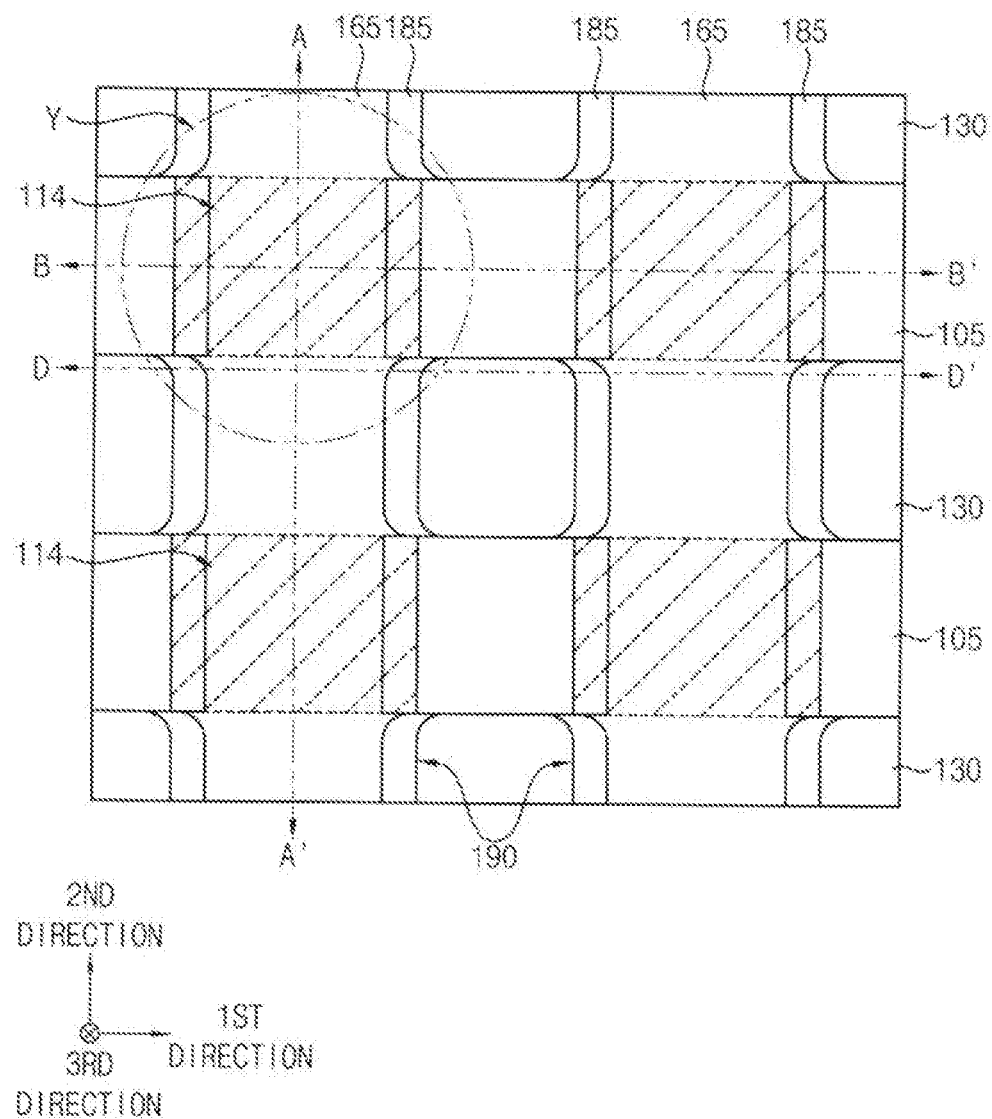
Figure 32:
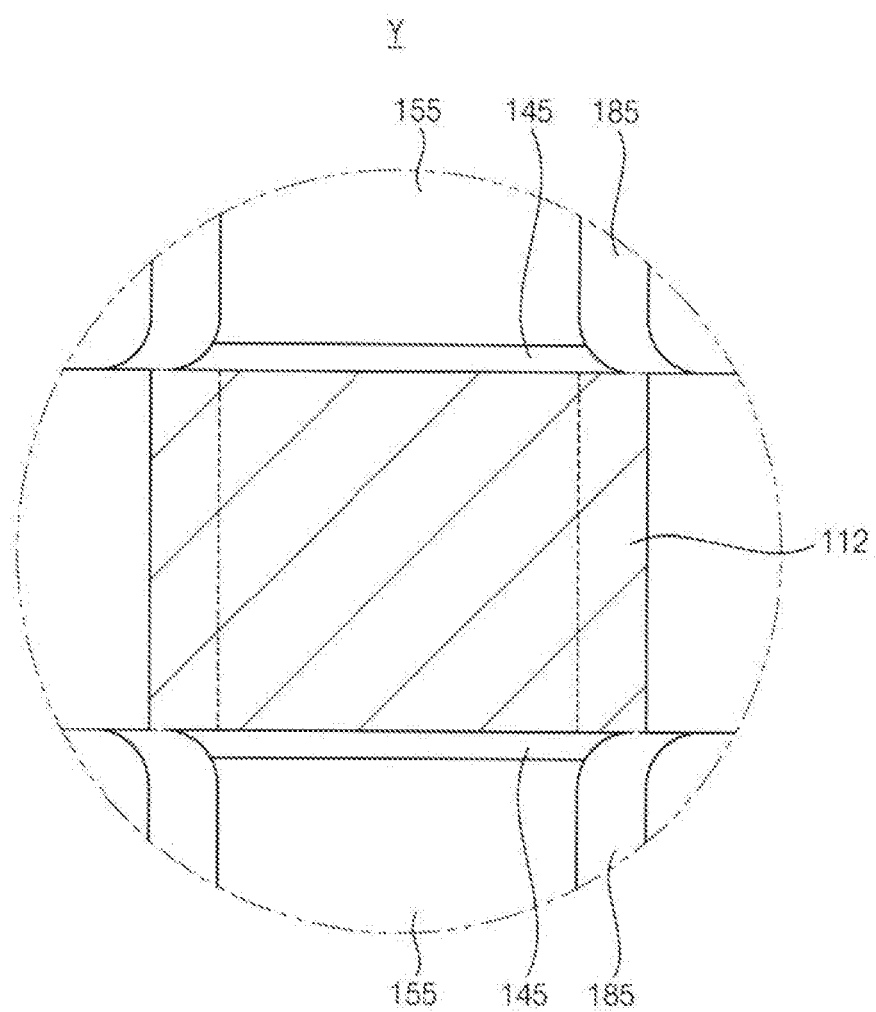
Figure 33:
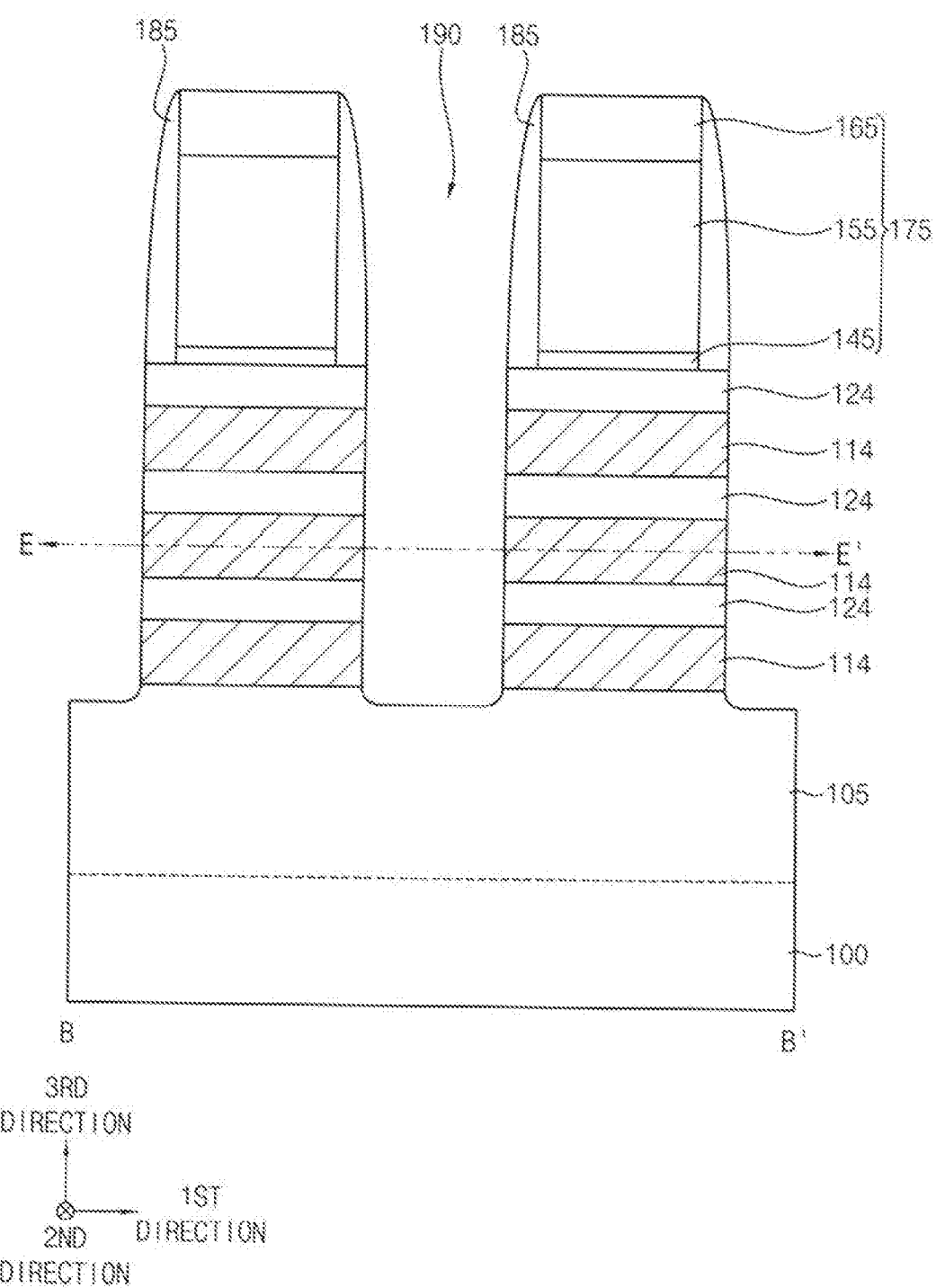
Figure 34:
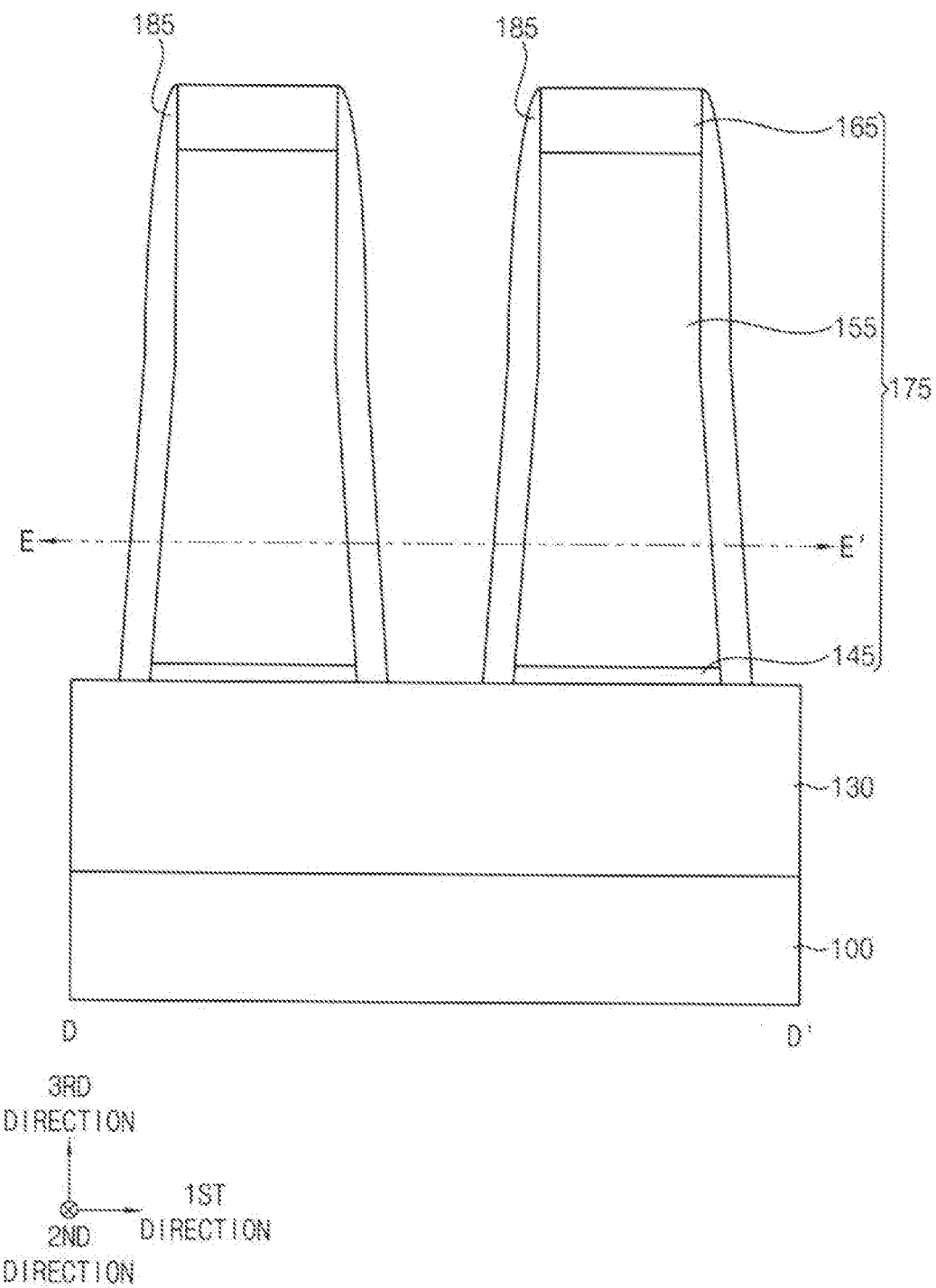
Figure 35:
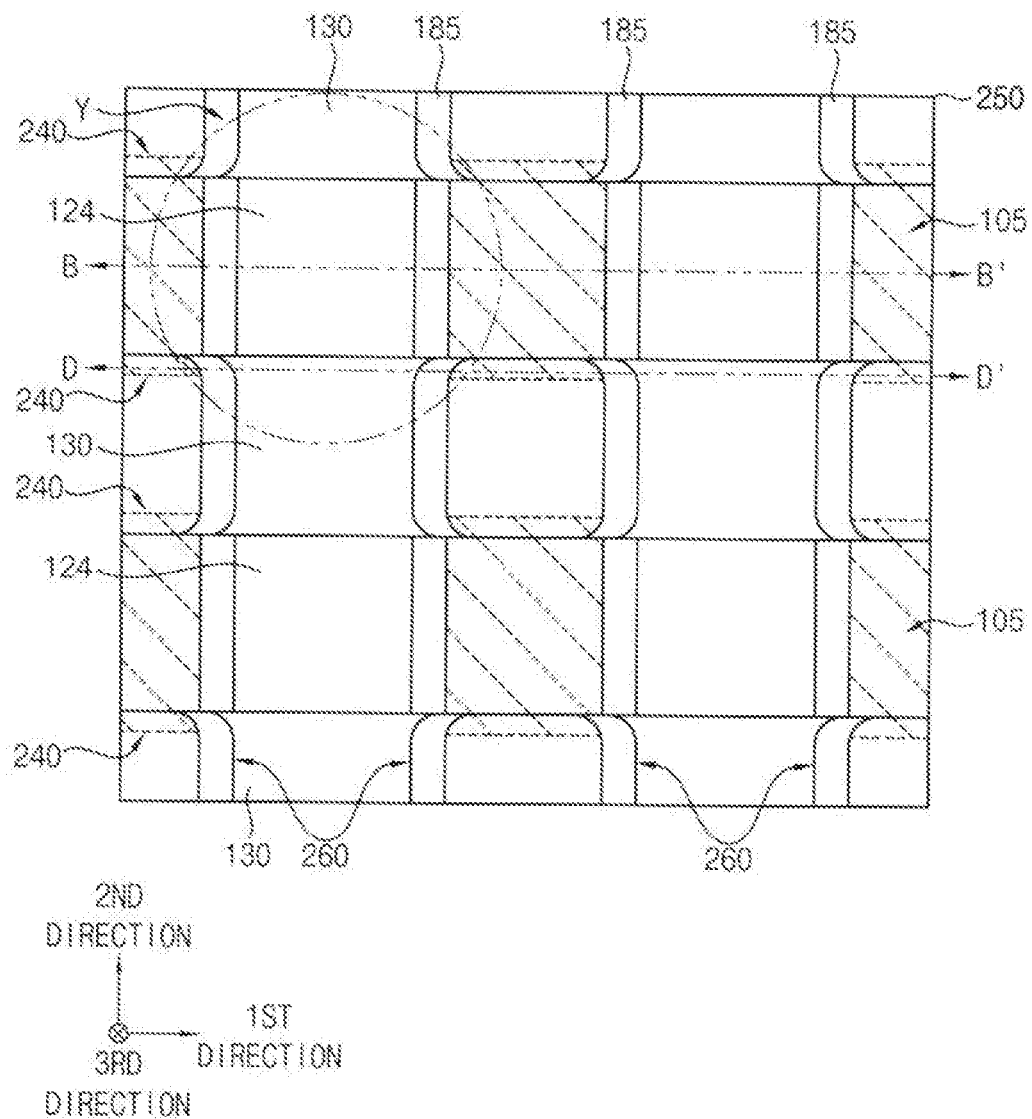
Figure 36:
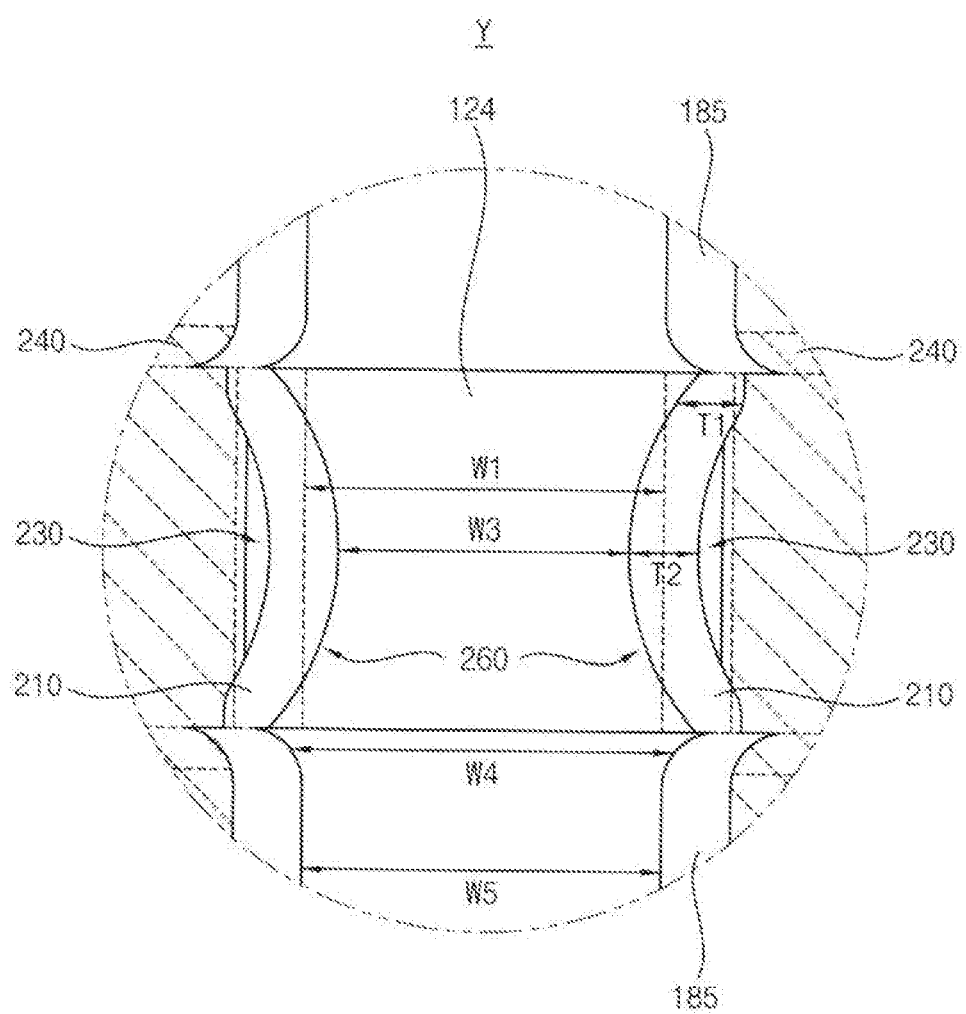

FIGS. 26 to 38 are plan views and cross-sectional views illustrating a method of manufacturing a semiconductor device in accordance with an example embodiment of the present inventive concept. Particularly, FIGS. 26, 31 and 35 are the plan views, FIGS. 27, 32 and 36 are horizontal cross-sectional views, and FIGS. 28-30, 33-34, and 37-38 are vertical cross-sectional views.

Figure 26:
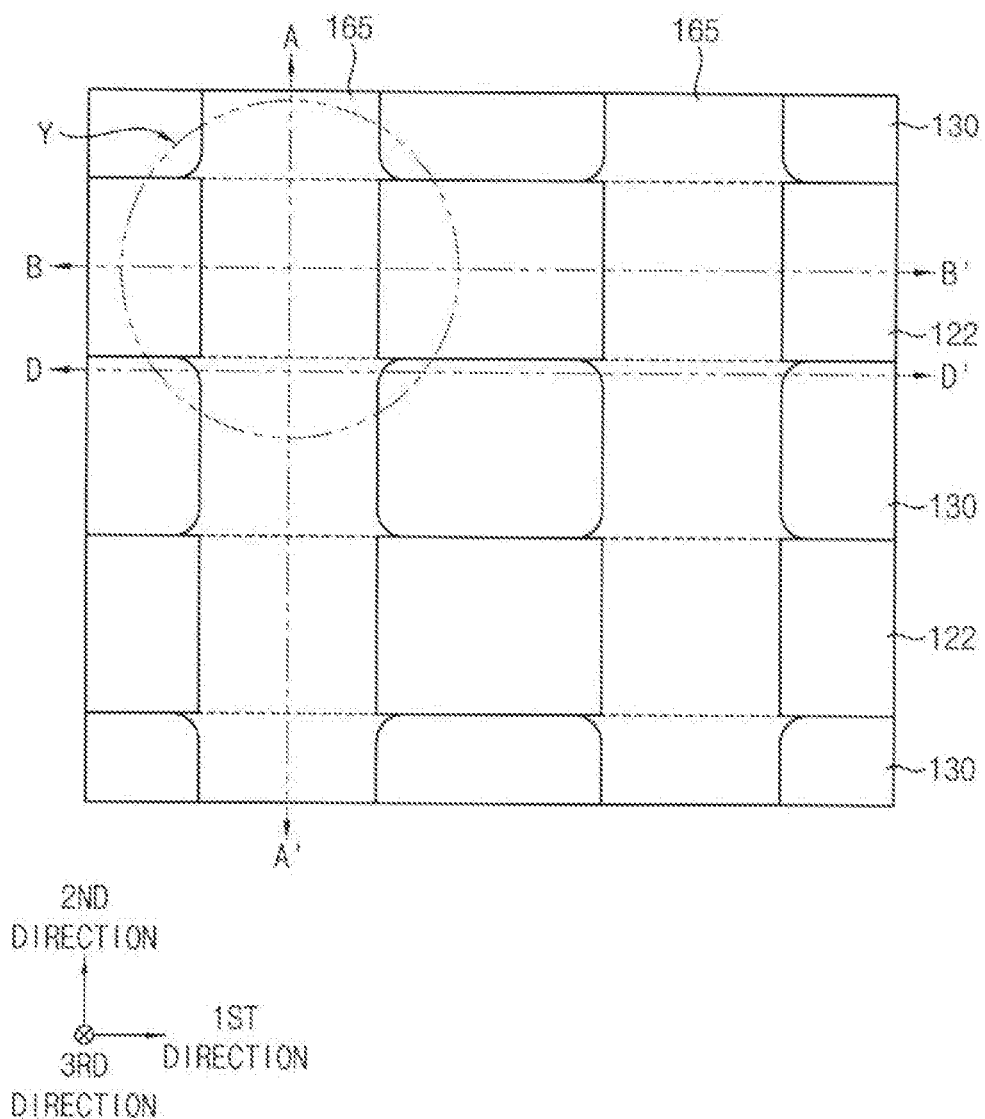
FIGS. 26 to 38 are plan views and cross-sectional views illustrating a method of manufacturing a semiconductor device in accordance with an example embodiment of the present inventive concept.
Figure 27:
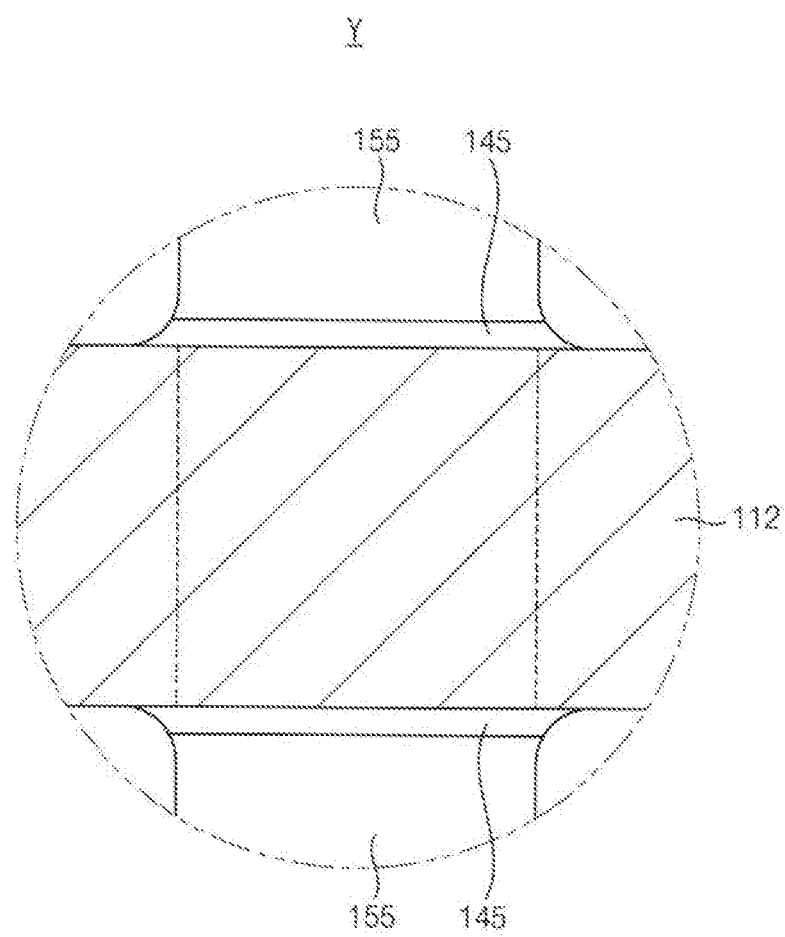
Figure 28:
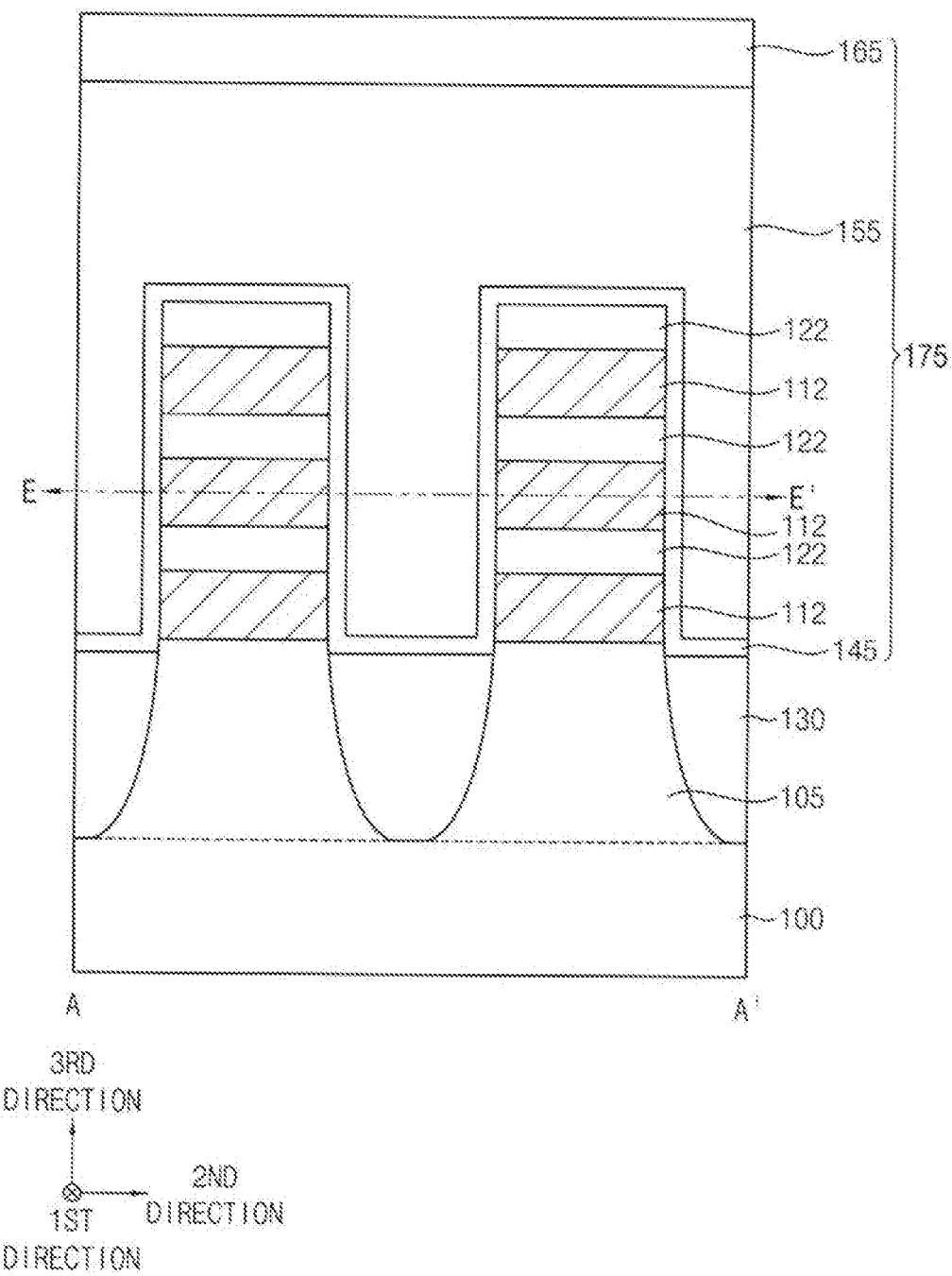
Figure 37:
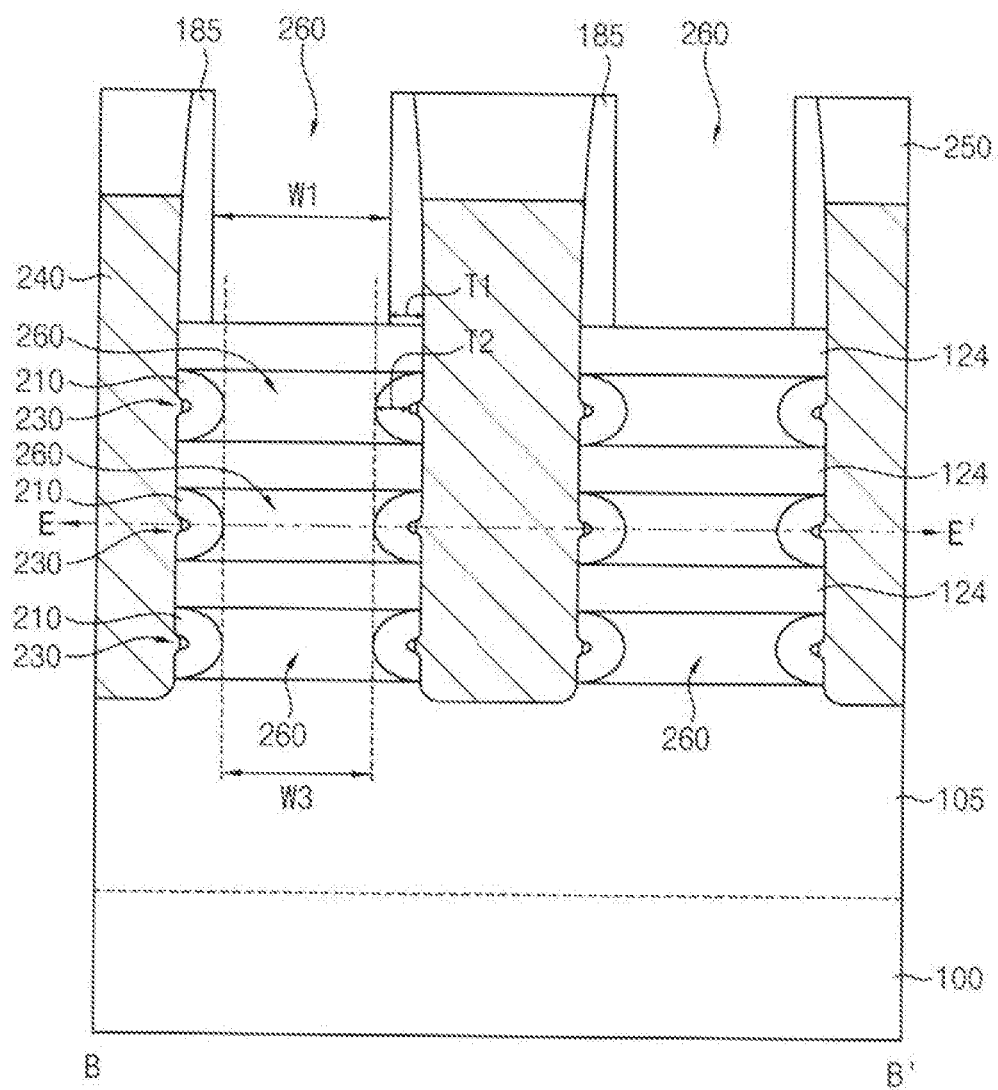
Figure 38:
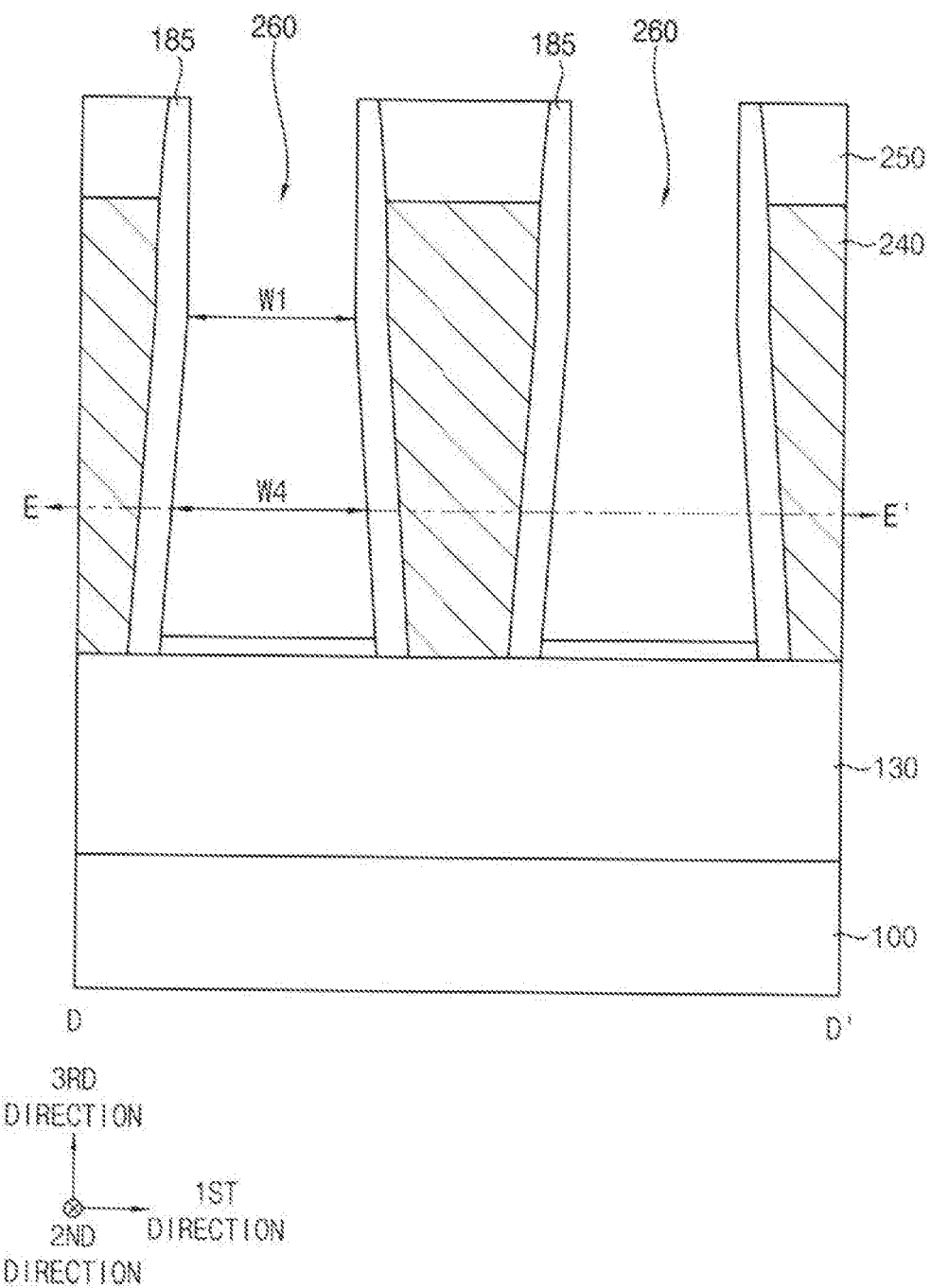

FIG. 28 is a cross-sectional view taken along a line A-A' of a corresponding plan view, in which the corresponding plan view may include FIG. 26. FIGS. 29, 33 and 37 are cross-sectional views taken along lines B-B' of corresponding plan views, in which the corresponding plan views may include FIGS. 26, 31 and 35. FIGS. 30, 34 and 38 are cross-sectional views taken along lines D-D' of corresponding plan views, in which the corresponding plan views may include FIGS. 26, 31 and 35. FIGS. 27, 32 and 36 are horizontal cross-sectional views of corresponding plan views, which may be taken along lines E-E' of corresponding vertical cross-sectional views, in which the corresponding plan views may include FIGS. 26, 31 and 35 and the corresponding vertical cross-sectional views may include FIGS. 28, 33 and 37.

Referring to FIGS. 26 to 30, processes substantially the same as or similar to those illustrated with reference to FIGS. 6 to 9 may be performed, and processes substantially the same as or similar to those illustrated with reference to FIGS. 10 to 13 may also be performed.

Referring to FIGS. 26 and 30, when the dummy gate structure 175 is formed, the dummy gate electrode layer and the dummy gate insulation layer may not completely patterned at an area, e.g. the area crossed by line DD', close to each of opposite sidewalls of the fin structure in the second direction, and thus the portions of the dummy gate electrode 155 and the dummy gate insulation pattern 145 close to the opposite sidewalls of the fin structure in the second direction may have a width in the first direction greater than those of other portions thereof. As illustrated in FIG. 30, the increase of the width of the dummy gate structure 175 may be deepened from a top of the fin structure toward the upper surface of the substrate 100, and thus a portion of the dummy gate structure 175 close to the opposite sidewalls of the fin structure may have a slanted sidewall that may not be perpendicular to the upper surface of the substrate 100.

Referring to FIGS. 31 to 34, processes substantially the same as or similar to those illustrated with reference to FIGS. 14 to 16 may be performed.

Referring to FIGS. 31 and 34, as the increase of the width of the dummy gate structure 175 from a top of the fin structure toward the upper surface of the substrate 100, the first spacer 185 covering each of opposite sidewalls of the dummy gate structure 175 in the first direction may also have a slanted sidewall that may not be perpendicular to the upper surface of the substrate 100 at a height below the upper surface of the fin structure.

Referring to FIGS. 35 to 38, processes substantially the same as or similar to those illustrated with reference to FIGS. 17 to 21 may be performed.

In an example embodiment of the present inventive concept, after removing the sacrificial patterns 114, the second thickness T2 of the second spacer 210 may be substantially equal to the first thickness Ti of the first spacer 185, however, the present inventive concept may not be limited thereto. For example, in an example embodiment of the present inventive concept, the second thickness T2 of the second spacer 210 may be greater than the first thickness T1 of the first spacer 185. After removing the sacrificial patterns 114, the third width W3 in the first direction between second spacers 210 opposite in the first direction may be less than the first width W1 of the second opening 260 between inner sidewalls of opposite first spacers 185 in the first direction.

In an example embodiment of the present inventive concept, a width between the first spacers 185 opposite in the first direction and not overlapping the semiconductor pattern 124 in the third direction may change along the second direction. That is, the fourth width W4 between portions of the first spacers 185 relatively close to the semiconductor pattern 124 may be greater than the fifth width W5 between portions of the first spacers 185 relatively far from the semiconductor pattern 124. In an example embodiment of the present inventive concept, the fourth width W4 may increase from the top toward the upper surface of the substrate 100.

After performing processes illustrated in FIGS. 35 to 38, processes substantially the same as or similar to those illustrated with reference to FIGS. 22 to 25 may be performed to complete the fabrication of the semiconductor device. The semiconductor device illustrated in FIGS. 22 to 25 may be substantially the same as that of FIGS. 1 to 5, except for the shapes of the gate structure and the spacer.

The foregoing is illustrative of example embodiments of the present inventive concept and is not to be construed as limiting thereof. Although a few specific example embodiments have been described, those skilled in the art will readily appreciate that many modifications are possible in the example embodiments without materially departing from the spirit and scope of the present inventive concept as defined by the appended claims.

What is claimed is:

1. A semiconductor device comprising:
   channels at a plurality of levels, respectively, the channels spaced apart from each other in a vertical direction on an upper surface of a substrate;
   a gate structure on the substrate, the gate structure at least partially surrounding a surface of each of the channels and extending in a first direction substantially parallel to the upper surface of the substrate;
   a source/drain layer at each of opposite sides of the gate structure in a second direction substantially parallel to the upper surface of the substrate and crossing the first direction, the source/drain layer being connected to sidewalls of the channels;
   a first spacer on each of opposite sidewalls of an upper portion of the gate structure in the second direction, the upper portion of the gate structure being on an upper surface of an uppermost one of the channels and overlapping the channels in the vertical direction; and
   a second spacer on each of opposite sidewalls of a lower portion of the gate structure in the second direction, the lower portion of the gate structure being between the channels and between the substrate and a lowermost one of the channels, and overlapping the channels in the vertical direction, wherein at a first height from the upper surface of the substrate in the vertical direction, a minimum value of a length in the second direction of a first portion of the gate structure overlapping the channels in the vertical direction is less than a length in the second direction of a second portion of the gate structure not overlapping the channels in the vertical direction, wherein at the first height, a length in the second direction of a third portion of the gate structure close to the channels is greater than a length in the second direction of a fourth portion of the gate structure far from the channels, the third portion and the fourth portion of the gate structure being in the second portion of the gate structure, and wherein, at the first height, the length in the second direction of the first portion of the gate structure increases as the first portion becomes closer to the second portion of the gate structure.

2. The semiconductor device of claim 1, wherein at a height below the upper surface of the uppermost one of the channels, the length in the second direction of the third portion of the gate structure increases as the height below the upper surface of the uppermost one of the channels decreases.

3. The semiconductor device of claim 1, wherein the first height is lower than the upper surface of the uppermost one of the channels.

4. The semiconductor device of claim 1, wherein, at a height above the upper surface of the uppermost one of the channels, the length in the second direction of the first portion of the gate structure is substantially constant along the vertical direction.

5. The semiconductor device of claim 1, wherein the channels are spaced apart from each other in the first direction at each level, and at the first height, the length of the gate structure in the second direction changes periodically along the first direction.

6. The semiconductor device of claim 1, wherein the second spacer has a vertical cross-section having a horseshoe shape convex toward a central portion of the lower portion of the gate structure in the second direction.

7. The semiconductor device of claim 6, wherein each of the first and second spacers contacts the source/drain layer, and an air gap is formed between the second spacer and the source/drain layer.

8. The semiconductor device of claim 1, wherein the gate structure further includes a lateral portion not overlapping the channels in the vertical direction, and the first spacer covers each of opposite sidewalls of the lateral portion of the gate structure in the second direction.

9. The semiconductor device of claim 8, wherein the first spacer has a slanted sidewall with respect to the upper surface of the substrate at a height below the upper surface of the uppermost one of the channels.

10. The semiconductor device of claim 1, wherein a first thickness of the first spacer in the second direction is equal to or smaller than a second thickness in the second direction of a central portion of the second spacer in the vertical direction.

11. The semiconductor device of claim 1, wherein the first and second directions are substantially perpendicular to each other.

12. A semiconductor device comprising:

channels at a plurality of levels, respectively, the channels spaced apart from each other in a vertical direction on an upper surface of a substrate;

a gate structure on the substrate, the gate structure at least partially surrounding a surface of each of the channels and extending in a first direction substantially parallel to the upper surface of the substrate;

a source/drain layer at each of opposite sides of the gate structure in a second direction substantially parallel to the upper surface of the substrate and crossing the first direction, the source/drain layer being connected to sidewalls of the channels;

a first spacer on each of opposite sidewalls of an upper portion of the gate structure in the second direction, the upper portion of the gate structure being on an upper surface of an uppermost one of the channels and overlapping the channels in the vertical direction; and a second spacer on each of opposite sidewalls of a lower portion of the gate structure in the second direction, the lower portion of the gate structure being between the channels and between the substrate and a lowermost one of the channels, and overlapping the channels in the vertical direction, wherein at a first height from the upper surface of the substrate in the vertical direction, a minimum value of a length in the second direction of a first portion of the gate structure overlapping the channels in the vertical direction is less than a length in the second direction of a second portion of the gate structure not overlapping the channels in the vertical direction, wherein at the first height, a length in the second direction of a third portion of the gate structure close to the channels is greater than a length in the second direction of a fourth portion of the gate structure far from the channels, the third portion and the fourth portion of the gate structure being in the second portion of the gate structure, wherein, at the first height, the length in the second direction of the first portion of the gate structure increases as the first portion becomes closer to the second portion of the gate structure, and wherein the second spacer has a vertical cross-section having a horseshoe shape convex toward a central portion of the lower portion of the gate structure in the second direction.

13. The semiconductor device of claim 12, wherein each of the first and second spacers contacts the source/drain layer, and an air gap is formed between the second spacer and the source/drain layer.

14. The semiconductor device of claim 12, wherein the gate structure further includes a lateral portion not overlapping the channels in the vertical direction, and the first spacer covers each of opposite sidewalls of the lateral portion of the gate structure in the second direction.

15. The semiconductor device of claim 12, wherein the first spacer has a slanted sidewall with respect to the upper surface of the substrate at a height below the upper surface of the uppermost one of the channels.

16. The semiconductor device of claim 12, wherein a first thickness of the first spacer in the second direction is equal to or smaller than a second thickness in the second direction of a central portion of the second spacer in the vertical direction.

17. A semiconductor device comprising:
an active region on a substrate;
channels at a plurality of levels, respectively, the channels spaced apart from each other in a vertical direction on the active region;
a gate structure on the substrate, the gate structure at least partially surrounding a surface of each of the channels and extending in a first direction substantially parallel to the upper surface of the substrate, and the gate structure including a gate insulation pattern and a gate electrode sequentially stacked from a surface of each of the channels;
a source/drain layer at each of opposite sides of the gate structure in a second direction substantially parallel to the upper surface of the substrate and crossing the first direction, the source/drain layer being connected to sidewalls of the channels;
a first spacer on each of opposite sidewalls of an upper portion of the gate structure in the second direction, the upper portion of the gate structure being on an upper surface of an uppermost one of the channels and overlapping the channels in the vertical direction; and
a second spacer on each of opposite sidewalls of a lower portion of the gate structure in the second direction, the lower portion of the gate structure being between the channels and between the substrate and a lowermost one of the channels, and overlapping the channels in the vertical direction,
wherein at a first height from the upper surface of the substrate in the vertical direction, a minimum value of a length in the second direction of a first portion of the gate structure overlapping the channels in the vertical direction is less than a length in the second direction of a second portion of the gate structure not overlapping the channels in the vertical direction,
wherein at the first height, a length in the second direction of a third portion of the gate structure close to the channels is greater than a length in the second direction of a fourth portion of the gate structure far from the channels, the third portion and the fourth portion of the gate structure being in the second portion of the gate structure, and
wherein, at the first height, the length in the second direction of the first portion of the gate structure increases as the first portion becomes closer to the second portion of the gate structure.

18. The semiconductor device of claim 17, wherein the gate structure further includes an interface pattern between the surface of each of the channels and the gate insulation pattern, the interface pattern including silicon oxide and the gate insulation pattern including a metal oxide.

19. The semiconductor device of claim 17, wherein at a height below the upper surface of the uppermost one of the channels, the length in the second direction of the third portion of the gate structure increases as the height below the upper surface of the uppermost one of the channels decreases.

20. The semiconductor device of claim 17, wherein the channels are spaced apart from each other in the first direction at each level, and
at the first height, the length of the gate structure in the second direction changes periodically along the first direction.

* * * * *